(12) United States Patent
Henderson et al.

(10) Patent No.: US 7,723,845 B2
(45) Date of Patent: May 25, 2010

(54) SYSTEM AND METHOD OF A HEAT TRANSFER SYSTEM WITH AN EVAPORATOR AND A CONDENSER

(75) Inventors: H. Thurman Henderson, Cincinnati, OH (US); Ahmed Shuja, Richmond, CA (US); Srinivas Parimi, Chandler, AZ (US); Frank M. Gerner, Melbourne, KY (US); Praveen Medis, Signature Park (LK)

(73) Assignee: University of Cincinnati, Cincinnati, OH (US)

( * ) Notice: Subject to any disclaimer, the term of this patent is extended or adjusted under 35 U.S.C. 154(b) by 361 days.

(21) Appl. No.: 11/932,911

(22) Filed: Oct. 31, 2007

(65) Prior Publication Data
US 2008/0110598 A1 May 15, 2008

Related U.S. Application Data

(63) Continuation of application No. 11/530,107, filed on Sep. 8, 2006.
(60) Provisional application No. 60/718,258, filed on Sep. 16, 2005.

(51) Int. Cl.
*H01L 23/12* (2006.01)
*H01L 31/028* (2006.01)

(52) U.S. Cl. .............. 257/722; 257/721; 257/E23.097; 257/E31.013; 165/207; 165/302; 165/DIG. 218; 62/332; 29/890.07; 361/701; 361/703; 361/705; 361/706

(58) Field of Classification Search ................. 257/721, 257/722, E23.097, E31.013; 165/207, 302, 165/DIG. 218; 62/332; 361/701, 703, 705, 361/706; 29/890.07
See application file for complete search history.

(56) References Cited

U.S. PATENT DOCUMENTS 3,843,463 A * 10/1974 Brown .......................... 203/49

(Continued)

FOREIGN PATENT DOCUMENTS

DE 10011253 9/2001

(Continued)

OTHER PUBLICATIONS

L.T., Canham, "Silicon Quantum Wire Array Fabrication by Electrochemical and Chemical Dissolution of Wafer", *Applied Physics Letters*, vol. 57, 1990, pp. 1046-1048.

(Continued)

*Primary Examiner*—Thanh V Pham
(74) *Attorney, Agent, or Firm*—Perkins Coie LLP

(57) ABSTRACT

The present invention is a MEMS-based two-phase LHP (loop heat pipe) and CPL (capillary pumped loop) using semiconductor grade silicon and microlithographic/anisotrophic etching techniques to achieve a planar configuration. The principal working material is silicon (and compatible borosilicate glass where necessary), particularly compatible with the cooling needs for electronic and computer chips and package cooling. The microloop heat pipes (μLHP™) utilize cutting edge microfabrication techniques. The device has no pump or moving parts, and is capable of moving heat at high power densities, using revolutionary coherent porous silicon (CPS) wicks. The CPS wicks minimize packaging thermal mismatch stress and improves strength-to-weight ratio. Also burst-through pressures can be controlled as the diameter of the coherent pores can be controlled on a sub-micron scale. The two phase planar operation provides extremely low specific thermal resistance (20-60 w/cm$^2$). The operation is dependent upon a unique micropatterened CPS wick which contains up to millions per square centimeter of stacked uniform micro-through-capillaries in semiconductor-grade silicon, which serve as the capillary "engine," as opposed to the stochastic distribution of pores in the typical heat pipe wick. As with all heat pipes, cooling occurs by virtue of the extraction of heat by the latent heat of phase change of the operating fluid into vapor.

13 Claims, 23 Drawing Sheets

U.S. PATENT DOCUMENTS

| | | | |
|---|---|---|---|
| 4,170,262 A | 10/1979 | Marcus et al. | |
| 4,685,512 A | 8/1987 | Edelstein et al. | |
| 4,697,205 A | 9/1987 | Eastman | |
| 4,825,661 A * | 5/1989 | Holtzapple et al. | 62/225 |
| 4,835,976 A * | 6/1989 | Torrence | 62/115 |
| 4,874,484 A | 10/1989 | Foell et al. | |
| 5,944,092 A | 8/1999 | Van Oost | |
| 6,227,288 B1 | 5/2001 | Gluck et al. | |
| 6,330,907 B1 | 12/2001 | Ogushi et al. | |
| 6,381,135 B1 | 4/2002 | Prasher et al. | |
| 6,533,029 B1 | 3/2003 | Phillips | |
| 6,552,901 B2 * | 4/2003 | Hildebrandt | 361/700 |
| 6,615,912 B2 | 9/2003 | Garner | |
| 6,654,860 B1 | 11/2003 | Strongin et al. | |
| 6,657,121 B2 | 12/2003 | Garner | |
| 6,745,825 B1 | 6/2004 | Nakamura et al. | |
| 6,799,628 B1 | 10/2004 | Masseth et al. | |
| 6,804,117 B2 | 10/2004 | Phillips et al. | |
| 6,810,946 B2 | 11/2004 | Hoang | |
| 6,840,304 B1 | 1/2005 | Kobayashi et al. | |
| 6,863,117 B2 | 3/2005 | Valenzuela | |
| 6,889,744 B2 | 5/2005 | Keetman et al. | |
| 6,889,755 B2 | 5/2005 | Zuo et al. | |
| 6,916,412 B2 | 7/2005 | Woodruff et al. | |
| 6,948,556 B1 | 9/2005 | Anderson et al. | |
| 6,972,365 B2 | 12/2005 | Garner | |
| 6,972,955 B2 | 12/2005 | Pleskach et al. | |
| 6,981,543 B2 | 1/2006 | Chesser et al. | |
| 7,002,247 B2 | 2/2006 | Mok et al. | |
| 7,013,956 B2 | 3/2006 | Thayer et al. | |
| 7,120,022 B2 | 10/2006 | Belady et al. | |
| 7,180,179 B2 | 2/2007 | Mok et al. | |
| 7,205,665 B1 | 4/2007 | Chung et al. | |
| 7,208,069 B2 | 4/2007 | Christophersen et al. | |
| 7,210,832 B2 | 5/2007 | Huang | |
| 7,251,889 B2 | 8/2007 | Kroliczek et al. | |
| 7,318,322 B2 | 1/2008 | Ota et al. | |
| 7,380,584 B2 | 6/2008 | Ippoushi et al. | |
| 7,407,083 B2 | 8/2008 | Rogers | |
| 7,431,071 B2 | 10/2008 | Wenger | |
| 2002/0135980 A1 | 9/2002 | Vafai | |
| 2003/0042009 A1 | 3/2003 | Phillips | |
| 2003/0051859 A1 | 3/2003 | Chesser et al. | |
| 2003/0066625 A1 | 4/2003 | Kirshberg et al. | |
| 2003/0075306 A1 | 4/2003 | Zuo et al. | |
| 2003/0192669 A1 | 10/2003 | Wu | |
| 2003/0211791 A1 | 11/2003 | Wu | |
| 2004/0206480 A1 | 10/2004 | Maydanik et al. | |
| 2005/0239292 A1 | 10/2005 | Christophersen et al. | |
| 2005/0274488 A1 | 12/2005 | Wu | |
| 2005/0280128 A1 | 12/2005 | Mok et al. | |
| 2006/0076046 A1 | 4/2006 | Ghoshal et al. | |
| 2006/0276047 A1 | 12/2006 | Ouyang et al. | |
| 2007/0095507 A1 | 5/2007 | Henderson et al. | |
| 2008/0048306 A1 | 2/2008 | Stewart et al. | |
| 2008/0115912 A1 | 5/2008 | Henderson et al. | |
| 2008/0115913 A1 | 5/2008 | Henderson et al. | |
| 2008/0128898 A1 | 6/2008 | Henderson et al. | |

FOREIGN PATENT DOCUMENTS

| | | |
|---|---|---|
| DE | 102004011394 | 9/2005 |
| DE | 10362083 | 5/2007 |
| EP | 0296348 | 12/1988 |
| JP | 200436308 | 12/2004 |
| KR | 2004032473 A | 4/2004 |
| WO | WO-9822767 | 5/1998 |
| WO | WO-02086994 | 10/2002 |
| WO | WO-2004097907 A2 | 11/2004 |
| WO | WO-2004097907 A3 | 11/2004 |

OTHER PUBLICATIONS

J. Carstensen, M. Christophersen, and H. Föll, "Crystal Orientation Dependence of Macropore Formation in n-type Silicon Using Organic Electrolytes," *Physics Status Solid A*, vol. 182, pp. 601-606, 2000.

S. Ronnebeck, J. Carstensen, S. Ottow, and H. Föll, "Crystal Orientation Dependence of Macropore Growth in n-type Silicon," *Electrochemical and Solid State Letters*, vol. 2, vol. 69, pp. 126-128, 1999.

V. Lehmann, "The physics of macropore formation in low doped n-type silicon", *Journal of Electrochemical Society*, vol. 140, No. 10, Oct. 1993, pp. 2836-2843.

V. Lehmann, U. Gruening, "The limits of macropore array fabrication", Thin Solid Films, vol. 297, No. 1-2 Apr. 1, 1997, p. 13-17.

Carstensen J., Christophersen M., Hasse G., Foll H., "Parameter Dependence of Pore Formation in Silicon within a Model of Local Current Bursts", *J. Electrochem Soc*, vol. 182, 63-69, (2000).

X. G. Zhang, "Morphology and Formation Mechanisms of Porous Silicon" Journal of Electrochemical Society, vol. 151, pp. C69-C80, 2004.

H. Föll, J. Carstensen, M. Christophersen, G. Hasse, "A New View of Silicon Electrochemistry" *Physics Status Solid A*, vol. 182, pp. 7-16, 2000.

Dhillion, et al., "A High Heat Flux Localized Cooling Technology for Electronic Substrates", Proceedings of 2008 International Mechanical Engineering Congress and Exposition, Nov. 2-6, 2008, Boston (2008), pp. 1-10.

Alexseev, "Micro Loop Heat Pipe Evaporator Coherent Pore Structures", Masters Thesis, Texas A&M University, Aug. 2003, pp. 1-116.

Ghajar, et al., "Numerical Modeling of Evaporator Surface Temperature of a Micro Loop Heat Pipe at Steady-State Condition", Journal of Micromechanics and Microengineering, vol. 15, pp. 1963-1971 (2005).

Oinuma, "Study of Evaporation Model in Micron Pore", A Dissertation for Doctorate of Philosophy, Texas A&M University, Aug. 2004, pp. 1-193.

IBM Touts New Liquid-Cooling Technique, IBM to Use Liquid to Cool 3D Chips, http://www.xbitlabs.com/news/coolers/display/20080606111039_IBM_Touts_New_Liquid_Cooling_Technique.html, pp. 1-4, Jun. 6, 2008.

Product-Chip Level Multilayer Channels for Spray Cooling Demonstrated 370W/cm2, http://www.zurich.ibm.com/news/06/cooling.html, Oct. 26, 2006, pp. 1-3.

Marques, "Manufacturing and Analysis of a LIGA Heat Exchanger for the Surface of a Cylinder: A Cooling Simulation of the Leading Edge Region of a Turbine Blade" 2002 Mechanical Engineering Graduate Student Conference, Louisiana State University, Apr. 13, 2002, pp. 29-30.

Ortega, "Thermal Engineering Research Motivated by Cooling of Electronic Systems: A National Science Foundation Perspective" Cisco Research Symposium Aug. 29-30, 2006, pp. 1-17.

http://www.ammt.com/, "Hydrofluoric Acid Vapor Etcher", p. 1, Feb. 24, 2009. <http://www.ammt.com/,%20%22Hydrofluoric%20Acid%20Vapor%20Etcher%22,%20Page%2 01,%20February%2024,%202009.>.

Zimbeck, et al, "Loop Heat Pipe Technology for Cooling Computer Servers", May 2008, pp. 19-25.

Cullis, et al., "The Structural and Luminescence Properties of Porous Silicon", Applied Physics Reviews, published Apr. 16, 1997, pp. 909-965.

Dhillon, et al., "MEMS Power: mLHP Chip Cooling System-Calumniated Wick and Device Design", Berkeley Sensor & Actuator Center Semi-Annual Research Report, Prepublication Data Mar. 2008, pp. 360-367.

Ghajar, et al., "A Hybrid CFD-Mathematical Model for Simulation of a MEMS Loop Heat Pipe for Electronics Cooling Applications", Journal of Micromechanics and Microengineering, Published 2005, pp. 313-321.

Cytrynowicz et al., "MEMS Loop Heat Pipe Based on Coherent Porous Silicon Technology", Space Technology and Applications International Form-STAIF, pp. 220-232, Nov. 17-22, 2002, New Orleans (2002).

Cytrynowicz et al., "Test Cell for a Novel Planar MEMS Loop Heat Pipe Based on Coherent Porous Silicon," Space Technology & Applications International Forum. pp. 230-232, Feb. 2-6, 2003. Albuquerque, New Mexico (2003).

Cytrynowicz et al., "The MEMS Loop Heat Pipe Based on Coherent Porous Silicon—The Modified System Test Structure," Space Technology and Applications International Forum, pp. 164-173, Feb. 8-11, 2004, Albuquerque, New Mexico (2004).

Hamdan et al., "Loop Heat Pipe (LHP) Development by Utilizing Coherent Porous Silicone (CPS) Wicks," ITHERM International Conference on Thermal Phenomena in Electronic Systems, pp. 457-465 San Diego, California (2002).

Holke et al., "Coherent Macro Porous Silicon as a Wick Structure in an Integrated Microfluidic Two-Phase Cooling System", *Proceedings of the 1998 SPIE Conference on Microfluidic Devices and Systems*, Santa Clara, Sep. 21-22, 1998, pp. 154-162 (1998).

International Search Report and Written Opinion for PCT Application PCT/US2006/035193 filed Aug. 9, 2006, International Search Report dated Feb. 5, 2007, 8 pages.

Mantravadi, Naresh, "MEMS-Based Development of a Silicon CPS Wick for Loop Heat Pipe Applications," Masters Thesis, University of Cincinnati, Cincinnati, Ohio, (2000).

Suh et al., "Nucleate Boiling Inside the Evaporator of the Planar Loop Heat Pipe", International Mechanical Engineering Congress and Exposition, IMECE, Nov. 13-19, 2004, Anaheim, CA. (2004).

Suh et al., "Operating Ranges of the Planer Loop Heat Pipe", Proceedings of ASME Summer Heat Transfer Conference. HT2005. Jul. 17-20, 2005. San Francisco. CA. (2005).

V. Lehmann, "Electrochemistry of Silicon Instrumentation, Science, Materials and Applications," Wiley-VCH Verlag GmbH, 2002, pp. 1-296.

A. Shuja, "Development of a Micro Loop Heat Pipe, a Novel Mems System Based on the CPST Technology", M.S. Thesis, University of Cincinnati, 2003, pp. 1-264.

* cited by examiner

Prior Art Fig. 13

SYSTEM AND METHOD OF A HEAT TRANSFER SYSTEM WITH AN EVAPORATOR AND A CONDENSER

CROSS-REFERENCE TO RELATED APPLICATIONS

This application is a continuation of U.S. patent application Ser. No. 11/530,107, filed Sep. 8, 2006, entitled "Silicon MEMS Based Two-Phase Heat Transfer Device," which claims the benefit of provisional application Ser. No. 60/718, 258, filed Sep. 16, 2005, the content of which are incorporated by reference into this application as if fully set forth herein.

FIELD OF THE INVENTION

This invention generally relates to methods and devices for heat transfer and dissipation on various applications (e.g., the microelectronics field) and, more specifically, to two-phase heat transfer devices fabricated by microelectromechanical systems (MEMS) technology for thermal management and cooling of semiconductor devices. The device(s) may also be applied to any application where heat is to be removed from an appropriate surface.

BACKGROUND OF THE INVENTION

Semiconductor makers have been struggling to find new ways to cool increasingly powerful chips. New chips generate more waste heat because of the increasing numbers of circuits being packed into the chips. As circuit dimensions shrink into the nanometer realm, waste heat becomes a significant problem. Increasing power densities, even with smaller switching potentials, causes the chips to warm to unacceptable temperatures. This condition has lead to ever increasing space consumed by packaging schemes for heat transfer away from the chip-level electronics.

Heat sink and fan assemblies are large, which makes them less useful as the microelectronics industry moves towards thinner and smaller devices. For instance, while heat sink or fan assemblies are widely used in desktops, laptops cannot accommodate these components. Another disadvantage of these assemblies is their low convective heat transfer coefficients due to room temperature air acting as the cooling fluid. Air has low density, low thermal conductivity, and low specific heat, resulting in low heat load carrying capacity. The average convective heat transfer coefficient of forced air convection is typically in the range of 10-200 $W/m^2$ K. In contrast, the use of two-phase liquid cooling allows for heat transfer coefficients ranging from 10,000-100,000 $W/m^2$ K.

Liquid cooling was first used in the 1960's to remove heat from bipolar junction transistor (BJT)-based processors when air-cooling did not perform adequately. The introduction of complementary metal oxide semiconductor (CMOS) technology in the early 1990's reduced the necessity of liquid cooling because the material produces less excess heat. Due to the increased number of feature on CMOS-based processors, liquid cooling is becoming useful again. In April 2005, IBM introduced a water-cooled heat exchanger mounted to the back cover of a 19-inch server rack. The processors are cooled using a cooling distribution unit to supply the water, and the heat load is dissipated to the building's chilled water line. While not cutting edge technology, the use of this method signals the coming of a wide spread industry acceptance of liquid cooling solutions.

An increasingly common liquid cooling device, the heat pipe, is used extensively in cooling applications. Micro-heat pipes use small ducts filled with a working fluid to transfer heat from high temperature devices to a remote heat sink. A typical heat pipe for semiconductor devices is a circular metal tube that has its interior wall coated with a wick structure. Evaporation and condensation of the fluid transfers heat through the duct. As heat from a device is applied, the fluid in the wick of the evaporator section of the device vaporizes, removing latent heat. The vapor travels through the channel to the cooled condenser region of the structure, where the latent heat is released by condensation of the vapor. The condensed vapor moves back to the evaporator region along the wick structure by capillary force along the interior wall of the heat pipe. Heat pipes are limited because they are mostly cylindrical, have vapor and liquid moving counter to one another in the same channel, and often cannot dissipate heat fluxes greater than 10 $W/cm^2$.

Recently, loop heat pipes (LHPs) have been utilized to remove heat from high density electronics and have been employed by the aerospace industry as well. FIG. 1A shows a schematic representation of a conventional LHP. In traditional devices, the cooling package or "evaporation pump" 1 is normally a simple cylindrical metallic heat pipe, filled with a porous ceramic metallic oxide (sintered) that serves as the wick for the working fluid. When heat 2 is externally applied, the working fluid is evaporated from the wick surface. The vapor enters surface grooves extruded or cast on the wick surface, which direct the vapor into the vapor line 3. The vapor travels to the condenser 4, where the latent heat 5 is extracted typically by cooling air, cooling liquid, or radiation to space. The condensed liquid returns to the reservoir 6 by virtue of the vapor pressure head in the lower line 8. The porous wick returns the working fluid through random pores by capillary action back to the hot surface to begin the process anew. In a similar device called a capillary pumped loop (CPL) heat pipe (FIG. 1B), the reservoir 6 is a separate ballast which may work by gravity or other forced feed 7, On or about May 22, 2003, Ahmed Shuja submitted a masters thesis to the University of Cincinnati entitled "Development of a Micro Loop Heat Pipe, A Novel MEMS System Based On The CPS Technology." This masters thesis, as well as all of the references cited therein, are incorporated by reference into this application as if fully set forth herein.

On Dec. 22, 2005, U.S. utility patent application Ser. No. 10/872,575 (filed Jun. 18, 2004) was published as Pub. No. 20050280128. The title of the publication is "Thermal Interposer For Thermal Management Of Semiconductor Devices." The content of this publication is incorporated by reference into this patent application as if fully set forth herein.

On Sep. 26, 2002, U.S. patent application Ser. No. 10/026, 365 (filed Dec. 18, 2001) was published as Patent Application Publication No. 2002/0135980. The publication is entitled "High Heat Flux Electronic Cooling Apparatus, Devices and System Incorporating The Same." The content of this publication is incorporated by reference into this application as if fully set forth herein.

U.S. Pat. No. 6,804,117 entitled "Thermal Bus for Electronics Systems" issued on Oct. 12, 2004. The content of this patent is incorporated by reference into this application as if fully set forth herein.

U.S. Pat. No. 6,972,955 entitled "Electro-Fluidic Device And Interconnect And Related Methods" issued on Dec. 6, 2005. The application that resulted in this patent was filed on Sep. 25, 2003. The content of this patent is incorporated by reference into this application as if fully set forth herein.

U.S. patent application Ser. No. 11/124,365 (filed May 6, 2005) was published on Apr. 6, 1006 as Patent Application Publication No. 2006/0076046. The publication is entitled "Thermoelectric Device Structure And Apparatus Incorporation The Same." The content of this patent is incorporated by reference into this application as if fully set forth herein.

Semiconductor makers have been struggling to find new ways to cool their increasingly powerful chips. For example, Intel recently cancelled its 4-gigahertz Pentium 4 processor because of increasing heat dissipation problems. Intel has resorted to investigating dual core technologies which reduce waste heat by lower power consumption. However, the consortium between IBM, Toshiba, and Sony plans to use a 16 core processor in forthcoming products that will push the limits of processing power and waste heat mediation. While waste heat has been a industry-wide problem, cooling solutions will be of utmost importance as circuit dimensions shrink into the nanometer realm causing chips consume more power and give off more heat. The invention herein provides a solution to this and similar cooling problems.

BRIEF DESCRIPTION OF THE DRAWINGS

Various examples, objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENTS

The present invention overcomes problems with the prior art by providing improved thermal transfer devices for removal of heat from a high temperature device, such as integrated circuit chips and microprocessors.

Figure 2:
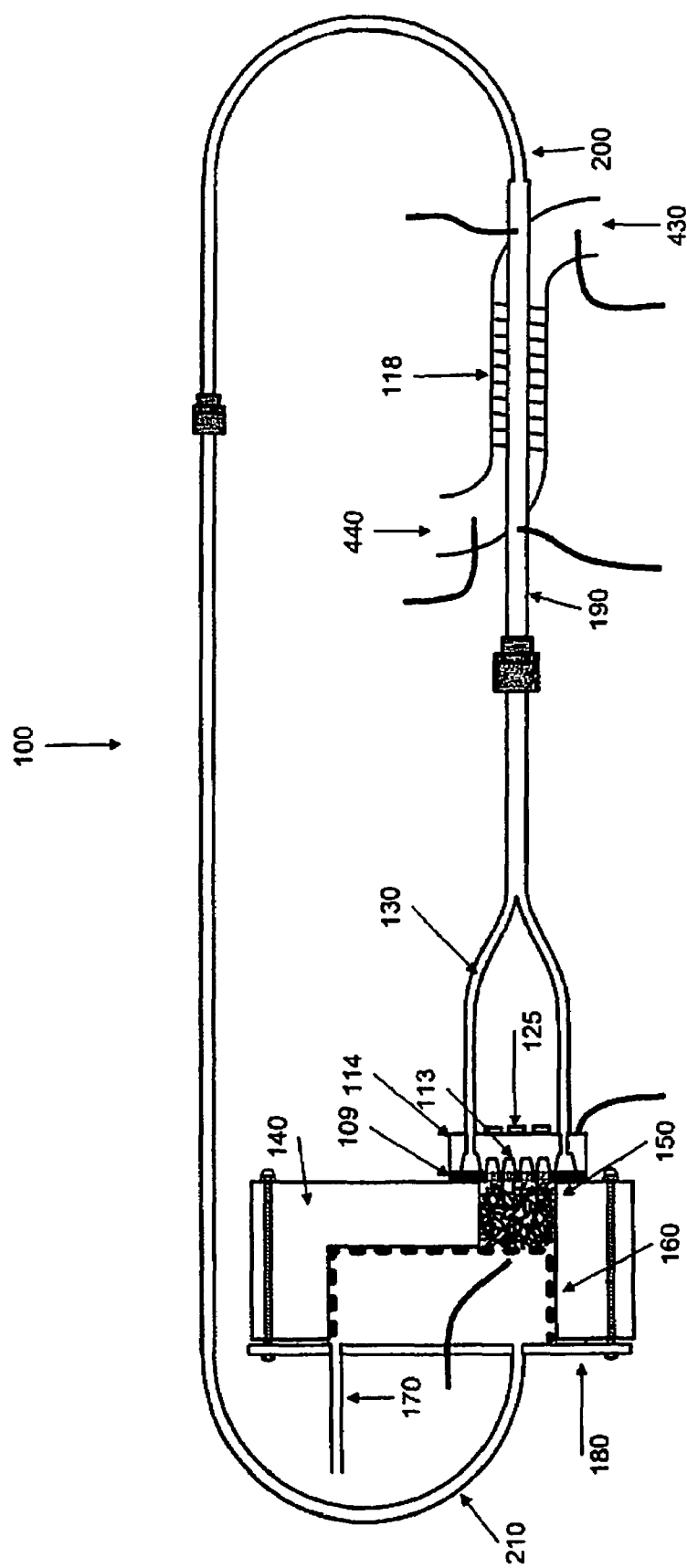
FIG. 2 is a cross-sectional schematic of one embodiment of the two-phase thermal transfer device.

Two-phase silicon-based thermal transfer devices according to several exemplary embodiments of the present invention are described below. One embodiment of the basic construction of the thermal transfer device 100 is shown in FIG. 2. This embodiment includes an evaporator 101 connected to a condenser 118. The evaporator 101, passage ways 130,210 and the condenser 118 form a closed loop with hermetic sealing. After evacuating the device, using the fill/vacuum port 170, a liquid working fluid 112 is introduced via fill/vacuum port 170. The amount of liquid working fluid 112 introduced is often a fraction of the total loop internal volume. A heat source (e.g., an integrated or attached semiconductor chip or other device) 125 is cooled at the evaporator 101. The primary operation of this device is to transport heat from the evaporator 101 to the condenser 118. The heat at the condenser 118 is removed using methods illustrated in FIG. 2.

Figure 1A:
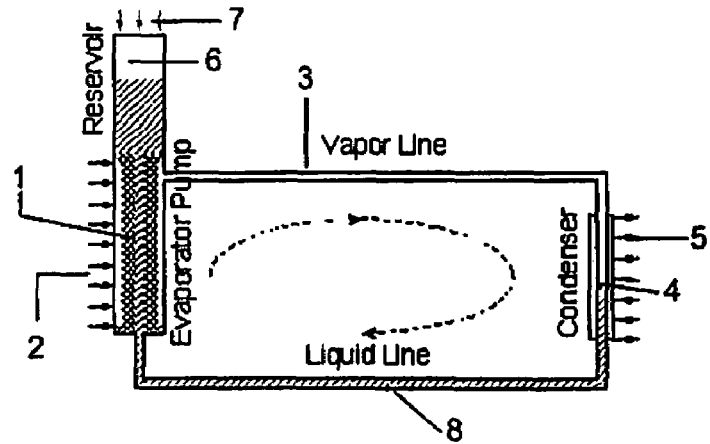
FIG. 1A is a schematic view of a conventional loop heat pipe using a metal sintered wick.
Figure 1B:
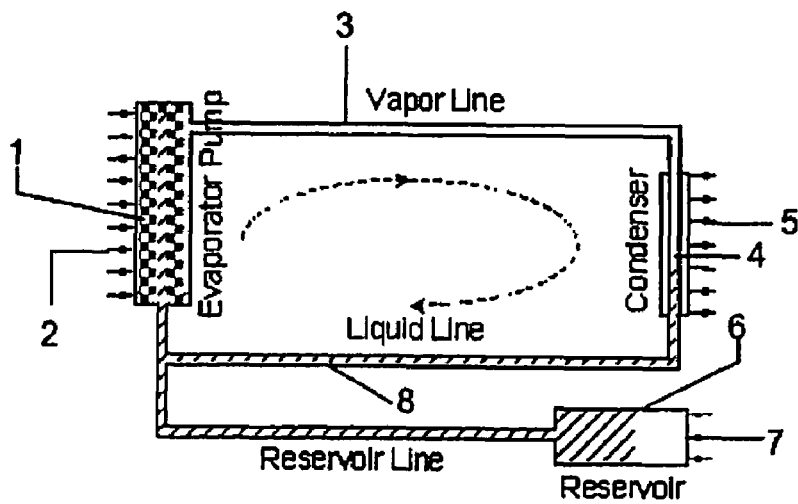
FIG. 1B is a schematic view of a conventional capillary pumped loop heat pipe using a metal sintered wick.

As shown in FIG. 2, the evaporator 101 consists basically of two or three bonded layers beginning as batch processed silicon wafers, typically [100] Si. The first silicon layer 114 is the silicon top-cap. The thermal top-cap has anisotropically etched grooves 113, created by KOH or EDP micropatterned anisotropic wet etching, that guide the evaporated working fluid to external ports 130. Other embodiments can have the cooling surface unencumbered without protruding ports (e.g., FIGS. 3 and 4). A silicon-based wick material 109 is bonded to the reservoir back plate 140. A secondary wick 150, constructed of packed silicon dioxide fiber ("quartz wool") in this embodiment or other glass or asbestos fiber, ensures uniform wick wetting preventing dry-out and failure. Secondary wick 150 is spring-loaded into the reservoir channel using a fitted stainless steel screen 160. The porosity of the secondary wick 150 can be varied depending on packing density, load, and size of fiber (usually, >90%). In some embodiments, a secondary wick will not be needed. The reservoir back plate 140 is constructed of compatible borosilicate glass for see-through capability or a silicon chip with a formed reservoir. The reservoir in 140 is anisotropically etched into silicon or formed in glass or silicon by, for example, a MEMS-based ultrasonic impact grinding (UIG) method that was uniquely developed for this application. See P. Medis, H. T. Henderson, "Micromachining Using Ultrasonic Impact Grinding" *J. Micromech. Microeng.* 2005, 15, 1556-1559, the content of which is incorporated by reference into this application as if fully set forth herein. The reservoir in 140 can be easily sized and placed as needed in an LHP-like configuration or etched as a side branch in a CPL-like configuration. Depending on the location within the base plate, possible MEMS-based "balloon" pressure can be added to the reservoir, as later discussed. Gravity or pressure enhancement can be achieved in the reservoir. The water input port 170 is connected using a novel bonding technique to the bottom reservoir plate 180. In this embodiment, the external surfaces containing input/exit ports (created by methods known to those skilled in the art, such as diamond-pointed mini-drills, UIG, chemical etching or by laser drilling) are coated with an evaporated or sputtered thin film of nickel (preferred) or gold over an adhesion layer of chromium. Stainless steel or copper nipples have been soldered and connected to other tubing (e.g., metallic, polymer) connecting to a specially designed condenser 118 that is either air- or fluid-cooled. The recondensed working fluid is recirculated in a similar fashion as the traditional LHP/CPL described in FIG. 1.

Figure 3:
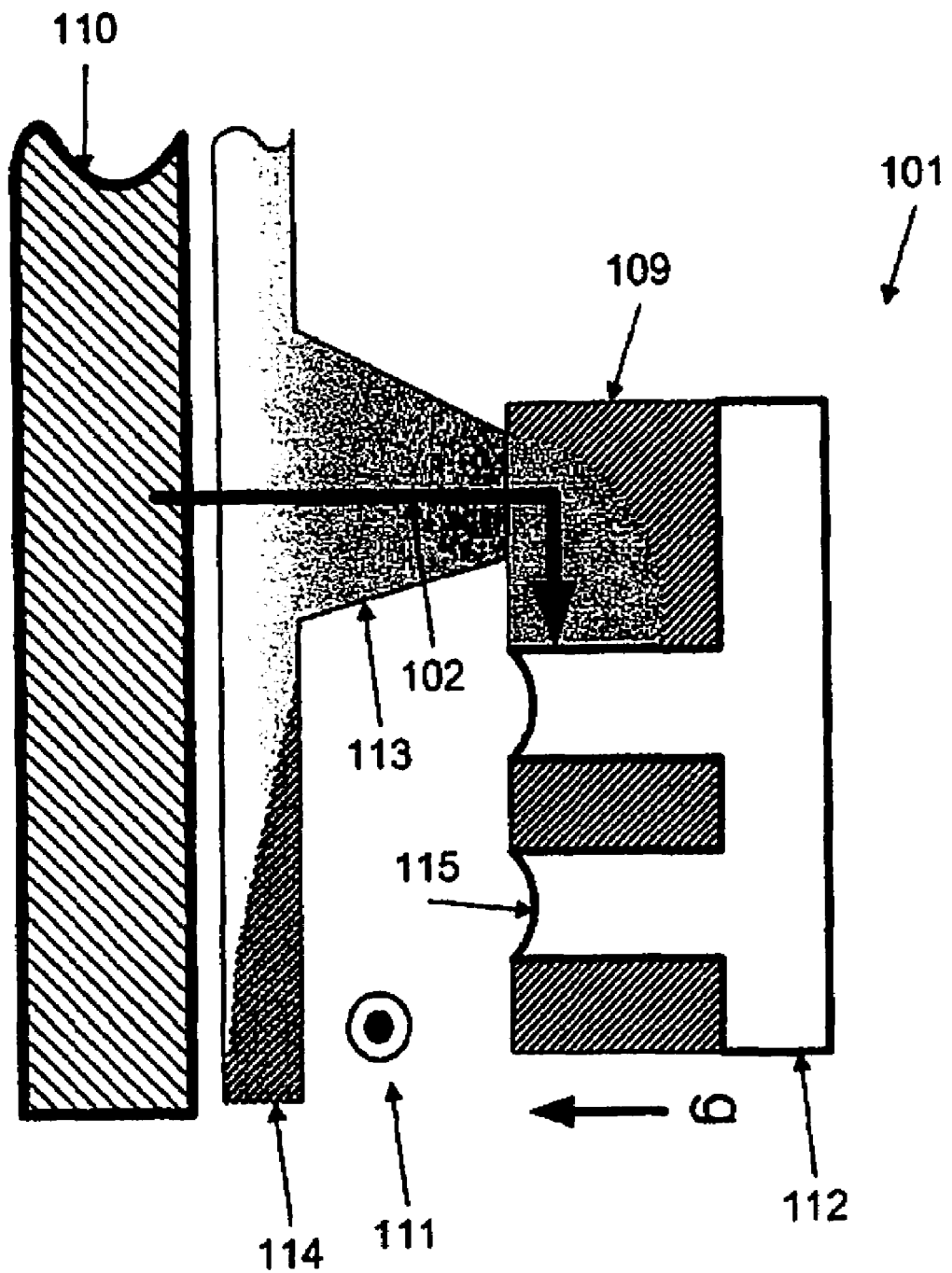
FIG. 3 is a partial cross-sectional view of the internal structure of an embodiment of an evaporator according to the present invention.
Figure 4A:
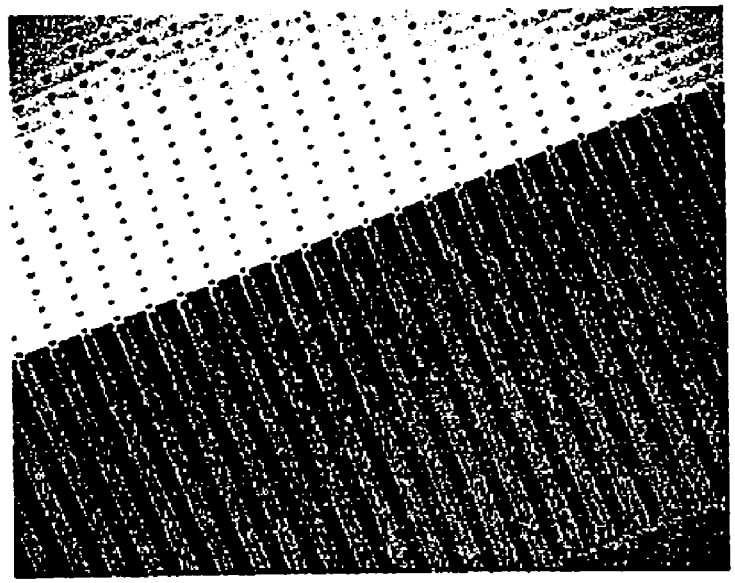
FIG. 4 shows SEM images of a coherent porous silicon (CPS) wick material with (A) 5 µm capillaries, spaced 20 µm on center, in a 250 µm thick Si [100] wafer and 6% porosity; (B) a 5 µm pore diameter with an 8 µm pitch and 39% porosity.
Figure 4B:
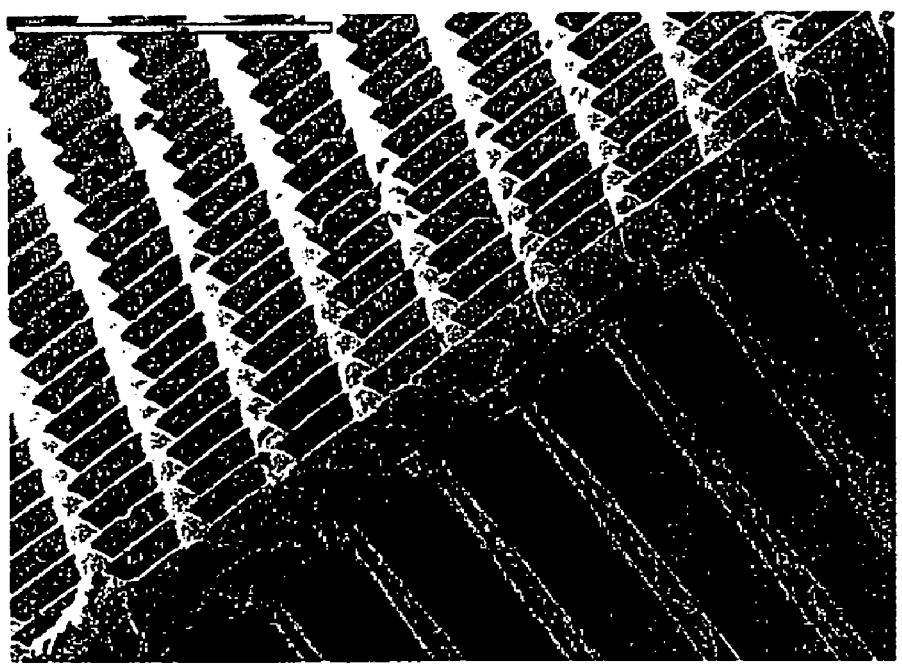

In one embodiment, the silicon-based evaporator 101 is directly attached to a prepackaged chip 110 as in FIG. 3. The silicon layer 109 is a wicking material made of coherent porous silicon (CPS), which is an array of highly uniform true through-capillary "worm holes," as shown in FIG. 4, unlike the ordinary sintered ceramic wicks with stochastically distributed intersecting pores of random sizes and distribution. The CPS wicks can posses a range of capillary wicking pressures, depending on the pore design. This high capillary wicking pressure allows the CPS wicks 109 to act as a membrane between the vapor 111 and liquid 112 phase. Heat 102 is delivered to the wick 109 directly from the chip 110 via silicon conduction pathways 113. As the wick 109 warms, fluid is evaporated from inside the CPS pores 115. The vapor is directed to a remote condenser through metallic or polymeric tubes which are directly connected to the silicon evaporator. The working fluid circulates by pressure differences that exist across the primary wick and the external loop.

Figure 5A:
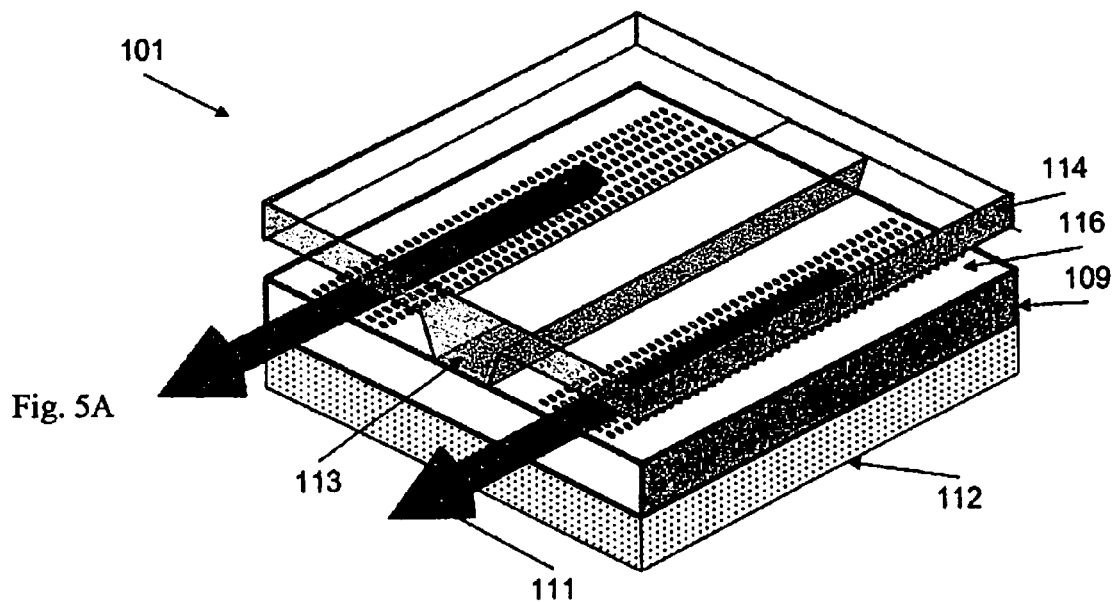
FIG. 5A is a single unit cell of the first embodiment of the evaporator demonstrating its planarity.
Figure 5B:
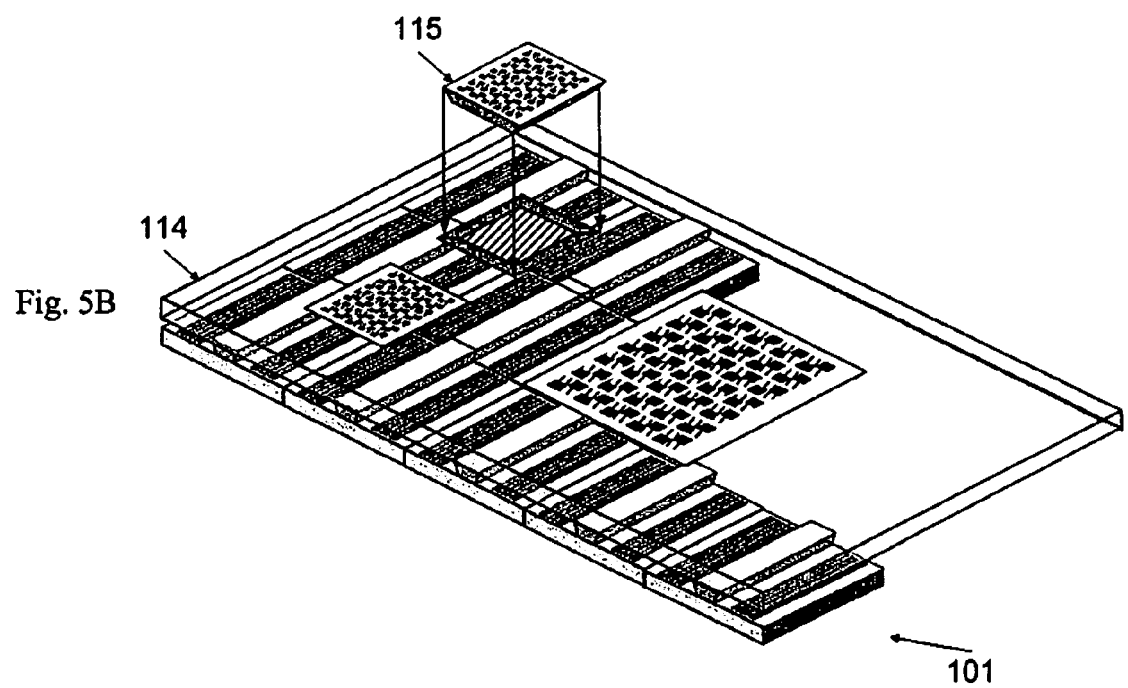
FIG. 5B illustrates multiple evaporators in an array to cool microelectronic chips at the die level.

FIG. 5(A) shows an embodiment of a single evaporator that is 500 µm². At this scale, a liquid working fluid 112 is resevoired below the CPS wick 109. The capillaries in the wick draw the liquid into the CPS wick 109, Heat travels from the heats source through the silicon top-cap 114 and the heat conducting structure 113 to the CPS wick 109. As the heat arrives, the working liquid 112 evaporates to vapor 111. The vapor travels along the vapor escape path 116, which is the space between the top-cap 114 and the CPS wick 109. In FIG. 5(B), an array of evaporators can be created to cool any size planar surface. In this embodiment, the evaporator array 101 cools unpackaged chip structures 115 that are directly mounted into the silicon top-cap 114. As shown, this invention can cool an entire system, as well as individual chips.

Figure 6:
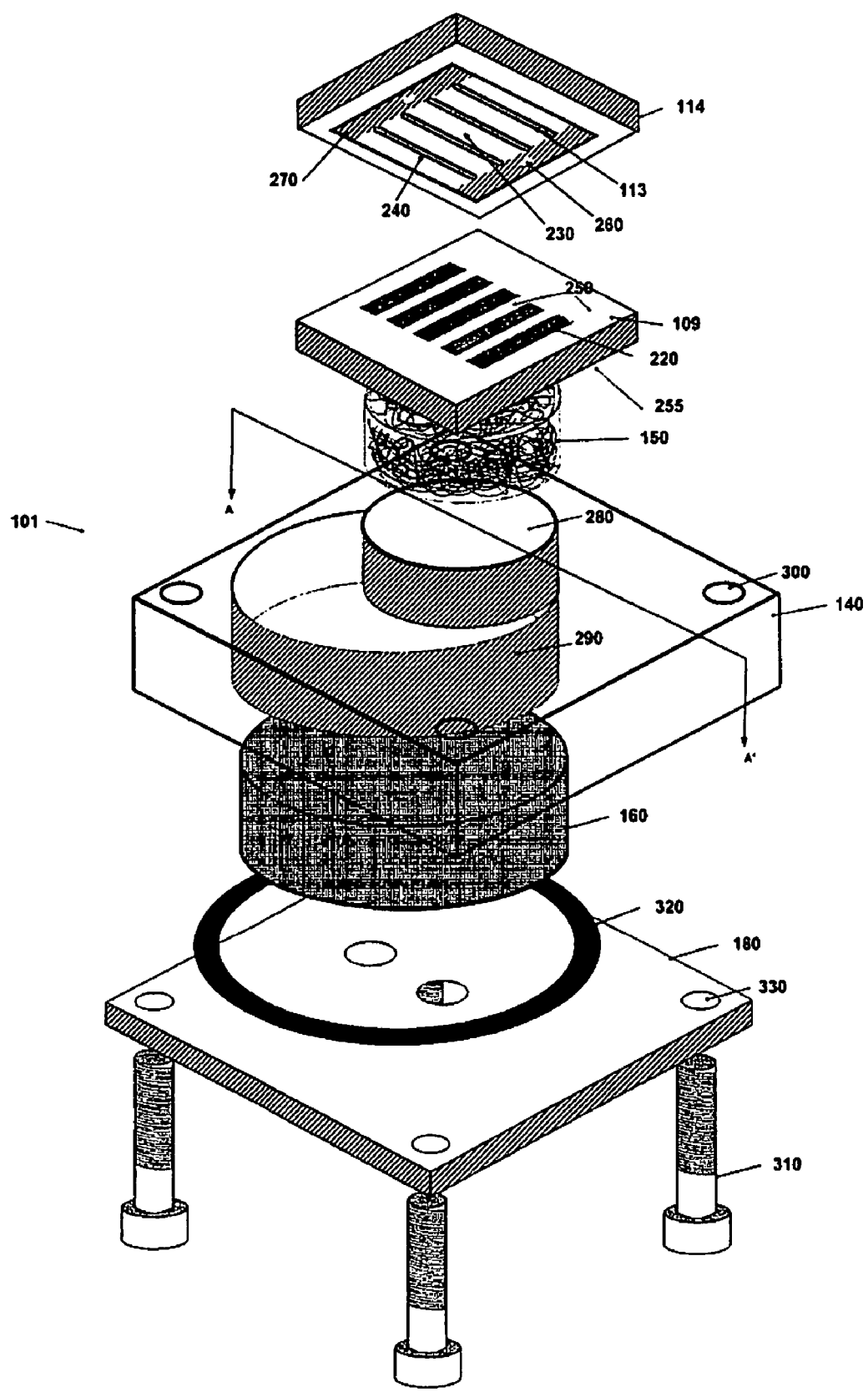
FIG. 6 is the exploded view of a second embodiment of the evaporator.

FIG. 6 is an exploded view of another embodiment of an evaporator 101. Evaporator 101 includes a top-cap 114, a CPS wick 109, and a compensation chamber 140. This embodiment provides a planar surface for attachment or integration of a heat source. Heat is uniformly distributed from the source to the evaporating surfaces 220 of the CPS wick 109 using heat conducting structures 113, Vapor escape paths 230, formed between the top-cap 114 and the CPS wick 109, are micromachined in the top-cap 114 using methods known to those skilled in the art. The vapor escape paths 230 can be a number of shapes in cross section, such as trapezoidal or rectangular. In certain embodiments, a flow field enhancement anisotropic champhering can be added using a convex corner undercut etching process at the end of the heat conducting structure 113. In this configuration, two vapor exit ports 260 are required on each side of the heat conducting structures 113. However, other embodiments allow for the top surface to be unencumbered. At each exit port 260, a vapor plenum 270 accommodates vapor 111 from multiple vapor escape paths 230.

The CPS wick 109 has microcapillary regions 220 patterned so that these regions match the top-cap 114 and provide spontaneous capillary action to pull the working fluid into the individual capillary pores to prevent dry-out failure. The capillary diameters in the evaporating region 220 are small enough to supply sufficient capillary pressure to avoid any burst-through of the top surface meniscus due to the pressure generated by the evaporation process. The wick 109 has non-porous surfaces 250 and 255 to bond to the top plate 114 at 260 and to the compensation chamber 140, respectively.

The compensation chamber 140 provides the CPS wick 109 with the working fluid 112. This is achieved by putting a specially prepared secondary fibrous wick 150 on the bottom surface of the CPS wick. Condensed working fluid from the condenser 118 is returned to the compensation chamber 140 via an attached liquid return line 210 (shown in FIG. 2). In FIG. 5, the compensation chamber 140 is typically made of a block of borosilicate or "Pyrex" glass (7740), though other ceramics or silicon may be used. The smaller of the two voids 280 houses the quartz fiber secondary wick 150. The larger void 290 is in contact with the bottom of void 280.

To construct the evaporator, the CPS wick 109 is eutectically bound to top-cap 14. This assembly is bonded onto the surface of the compensation chamber 140. Cavity 280 is filled with the quartz fiber secondary wick 150. Once the secondary wick 150 is packed to the required density, a stainless steel mesh retainer 160 is pushed through the larger cavity 290. A circular gasket 320, made of silicone in this embodiment, is placed against the compensation chamber 140. Finally, the stainless steel back plate 180 is placed and the package is sealed using four screws running through the holes 300 and 330.

Figure 7:
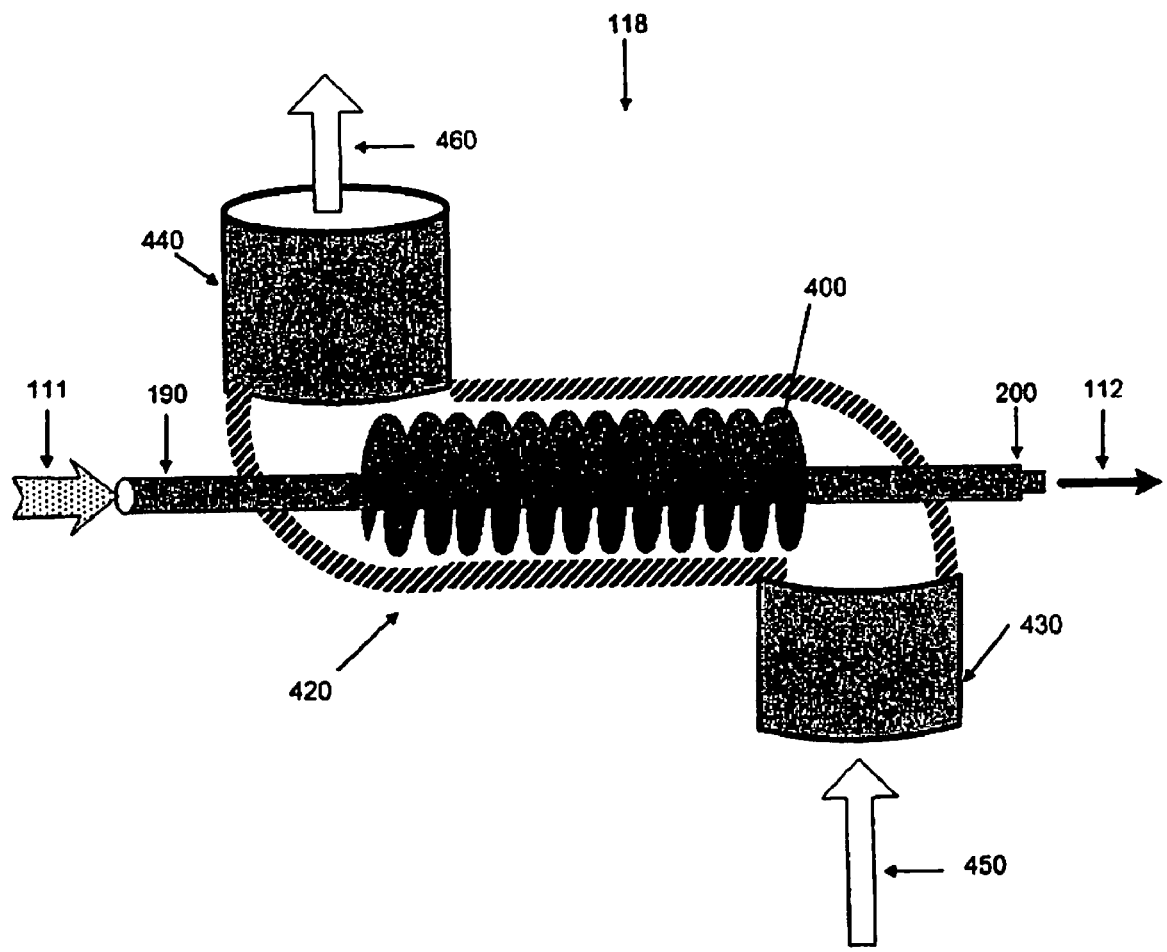
FIG. 7 is a cross-sectional view of one embodiment of a metallic cross flow condenser.

FIG. 7 shows a schematic of the forced fluid (typically liquid) cooled condenser 118. The condenser 118 has two tubes. The vapor flows in the inner condensing tube 190 to 200 that has a fin structure 400 to facilitate an enhanced heat transfer. Silver solder is used to attach the fins 400 to the inner tube 190 to 200. Both the inner condenser tube 190 to 200 and the internal fin structure 400 are typically made of copper. The inner tube 190 to 200 is enclosed by the outer tube 420, which is a coolant passage for pumped liquid flows. During operation of embodiment one of the device (100, FIG. 2), vapor 111 will flow into the condenser 118 via the condenser working fluid inlet 190, Likewise, the condensed vapor flows out of the condenser via the working fluid outlet 200. The absorbed latent energy of phase transformation form vapor 111 to liquid 112 will be transferred to the coolant flowing in the coolant passage 420. The supply of the coolant 450 to the condenser is via the coolant inlet 430 and the heated coolant 460 will flow out of the condenser 118 via the coolant outlet 440.

Figure 8:
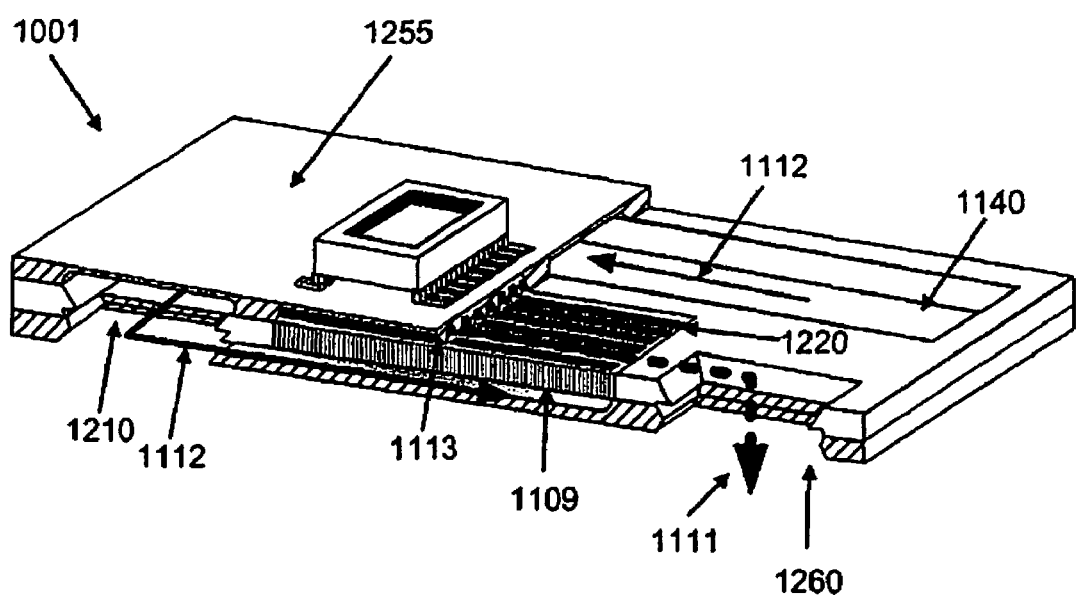
FIG. 8 illustrates an industrial applicable embodiment of a silicon evaporator.

In order to make this technology applicable in the industry, certain changes were made from the initial embodiment. For example, a second embodiment of the silicon evaporator 1001 is shown in FIG. 8. This low profile design consists of the same primary components as the first embodiment: a compensation chamber 1140, a primary CPS wick 1109, heat conduction pathways 1113 to interface with the primary CPS wick 1109 for uniform heat delivery to the evaporating surface 1220. The working fluid flow path is shown by 1112 Also the vapor exit ports 1260 may be brought out of the back side of the evaporator 1001, along with the liquid return port 1210, to clear the top surface 1255 for unencumbered thermal contact for cooling over the complete top surface. (Terms "top" and "bottom" need not necessarily have any gravitational relevance.) The density and size of the CPS micro capillaries may also be varied as required. The fiber secondary wick 150 (FIG. 6) is not necessary in cases where the thermal distribution is sufficiently uniform and other key parameters fall within the critical range.

Figure 9:
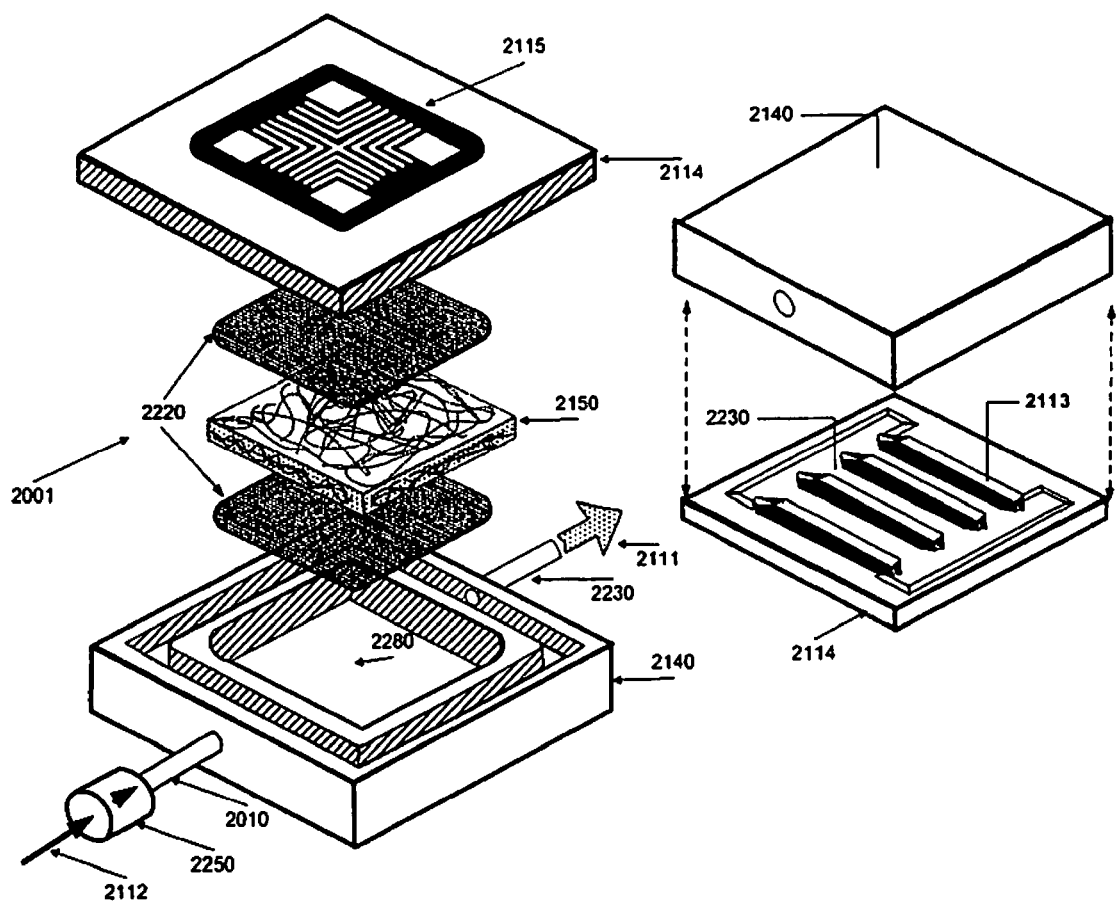
FIG. 9 is an exploded view of an industrial applicable embodiment of a silicon/silicon dioxide-based evaporator.

A third embodiment of an effective and inexpensive evaporator 2001, shown in FIG. 9 has demonstrated cooling in excess of 60 W/cm$^2$ using a version (random pile) of the SiO$_2$ microfiber as the primary wick 2150. This quartz evaporator consists of five primary components: a reservoir back plate 2140, a set of mesh metallic screens 2220, glass fibers 2210, a silicon top-cap 2114, and an external one-way valve 2250. A working fluid 2112 enters the quartz evaporator and experiences phase change to vapor 2111. During operation of the thermal transfer device, waste heat is dissipated from the heat source 2115 and conducts through the silicon top-cap 2114. The heat evaporates the liquid in reservoir 2280. The vapor is directed by vapor passageways 2230 to a vapor channel 2231 that exists in the reservoir back plate 2140. In this embodiment, a one-way valve 2250 is incorporated into the fluid return line near the reservoir to permit liquid flow in the forward direction. In addition to operating under vacuum, this device operates at ambient pressure in the presence of non-condensable gases.

In one embodiment, SiO$_2$ quartz wool fibers 2150 with diameters varying from 1 to 10 μm were used. The fiber mass can be compacted to give a smaller effective pore sizes. The quartz wool 2150 can be stacked with varying sized layers for a graded effective pore size. A stainless steel or other metallic screen 2220 (typically, copper for good thermal contact to the top cap rails 2113) is used to hold the fiber mass 2010. Other hydrophilic fibers, such as ordinary glass or asbestos, can be substituted for SiO$_2$. The reservoir back plate 2140 may be constructed of silicon or glass, as shown in FIG. 6, and the reservoir may be either anisotropically etched [100] silicon or may be configured in any arbitrary configuration by a MEMS-UIG in either silicon or glass (preferred). In those cases where condensable gases are tolerated, polymeric external tubes 2010 function as flexible substitutes for the ordinary vacuum-tight stainless steel or copper lines. An added advantage is that mass movement of fluid slugs can be followed. Transparent glass can be used to both visualize movement and seal for initial vacuum evacuation. In this embodiment, the CPL configuration (with an external series or parallel reservoir) has been shown to function very well, even when the reservoir is open to the atmosphere, typically with gravity feed. Again, all ports may be constrained to the reservoir side of the planar evaporator package.

Figure 10:
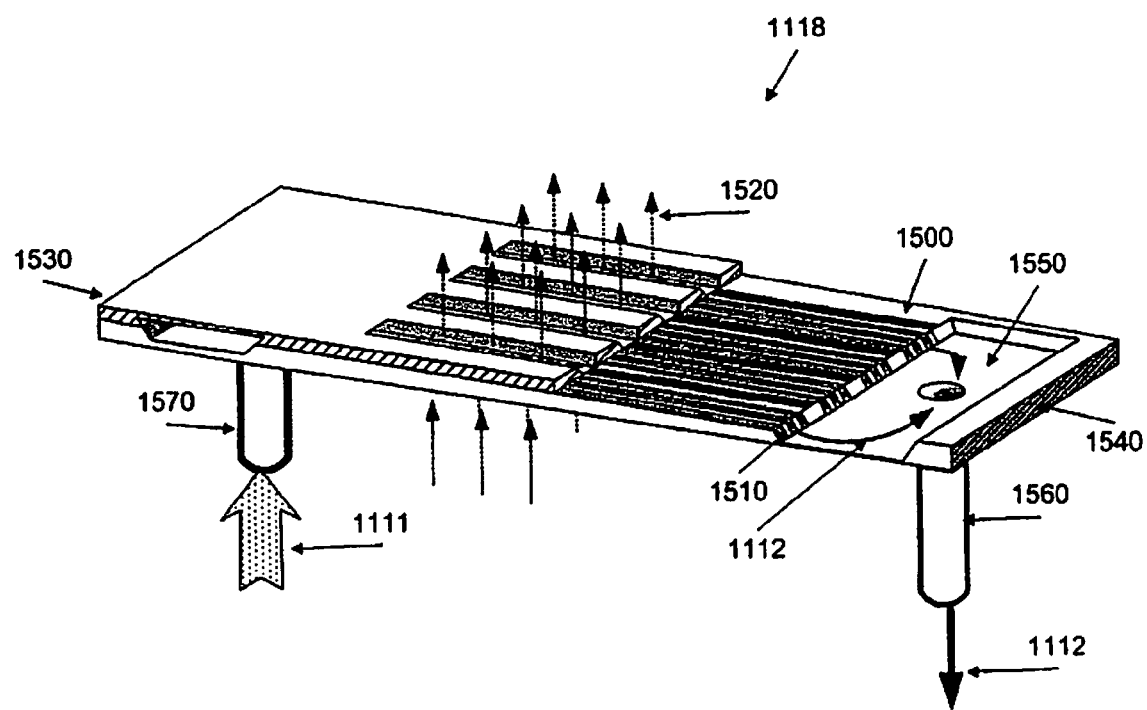
FIG. 10 illustrates an industrial applicable embodiment of an air cooled silicon condenser.

For use with the second and third evaporator embodiments, a MEMS-based silicon condenser 1118 is described in FIG. 10. The approach combines a planar design, leveraging the CPS microfabrication technique to form high porosity distributions of capillaries and fin structures in (100) silicon. The features 1500 and 1510 can be fabricated with lateral dimension ranging from a few to hundreds of microns while having aspect ratios ranging from 60-200. In this design, vapor 1111 enters the condenser arriving from the evaporator (e.g. 1001, FIG. 8). Due to the internal pressure difference between the liquid side of the wick 1009 and the evaporating surface 1220, vapor 1111 is forced through the fins structures 1510. Heat is absorbed from vapor 1111 via conduction through the thin silicon walls and exchanged through forced convection with a gas 1520 (e.g. air) cross flowing though the adjacent capillaries 1500. The planar design will maximize heat transfer between vapor 1111 internal to the device and gas 1520 by leveraging the large surface area exposed within the high aspect ratio silicon features. By using MEMS-batch fabrication, the silicon condenser 1118 can be made inexpensively, which offers significant cost to weight savings. The silicon-based condenser is key to achieving all silicon MEMS-based micro-LHPs that will be smaller, lighter, and more amenable to incorporation into dense and space limited electronics systems.

Various embodiments of the planar two-phase silicon-based thermal transfer device are variations and extensions of the primary embodiment and incorporate an evaporator embodiment and a condenser embodiment described above. For example, in FIG. 11, an embodiment of the thermal transfer device is shown with a low profile silicon based evaporator and condenser. For example, this embodiment would be useful in applications at the PCB board level. The thermal transfer device 100 interfaces with a planar heat source 110 so that heat flows into the evaporator 101. Within the evaporator, the working liquid vaporizes and moves along the vapor line 117 to a silicon based condenser 118. The vapor is air-cooled 119 resulting in condensation. The liquid recirculates to the evaporator 101 through the liquid line 120 due to the pressure difference that exists across the CPS wick.

This embodiment of the device is amenable to electronics use. The CPS wick 109 is planar which allows for a planar evaporator design 101. Also, the top-cap 114 and wick 109 is fabricated with CMOS-grade silicon, allowing for easy interface with a planar chip 110. This device has been shown to have a greater heat extraction capability than traditional commercial systems. This thermal transfer device is robust due to the passive operation of the device. This embodiment has shown excellent scalability ranging from chip level to large surface area cooling on the system level. The planar and cellular silicon configuration allows for trivial and infinite size power handling expansion using bonding and packaging techniques known to those skilled in the art. This embodiment allows for the overall effective thermal conductivity to be adjusted according to design by thermally oxidizing as much of the silicon structure as desired into oxide as silicon has a high thermal conductivity, whereas silicon dioxide has a very poor thermal conductivity.

Use of CPS wicks allows for direct control of vibration resistance and internal pressure handling capability. Failure of the capillary meniscus by burst-through is controlled by the largest surface pore. Commercially available wick structures are sintered, which severely limits control over pore diameter size on the submicron scale. Therefore, the largest pore in the random distribution controls burst-through failure. To the contrary, the CPS etching technique allows for CPS wick capillaries to be micro patterned with uniform and controllable pore size. Also, CPS wicks of small and uniform size minimize burst-through pressure, which is inversely proportional to the capillary diameter. In addition, the capillaries of the CPS wicks are inherently coated with $SiO_2$, which lowers burst-through pressure because the wetting constant of $SiO_2$ is high. The coherent capillaries of the CPS wicks geometrically maximize stacking, which allows for maximized porosity. Also, the ordinary lost viscous internal pressure drop in a wick is reduced to the ultimate minimum due to direct coherent through-paths, smooth walls, ultra-high porosity and very thin wicks (at least an order of magnitude thinner using CPS). Specifically, capillaries are patterned so that they are only located in between the contact rails of the top-cap. This distributes the heat from the top thermal caps uniformly to the wick surface. Also, other arrays may be useful and easily fabricated. Also, the multiple metallic components will lessen internal corrosion.

Figure 11:
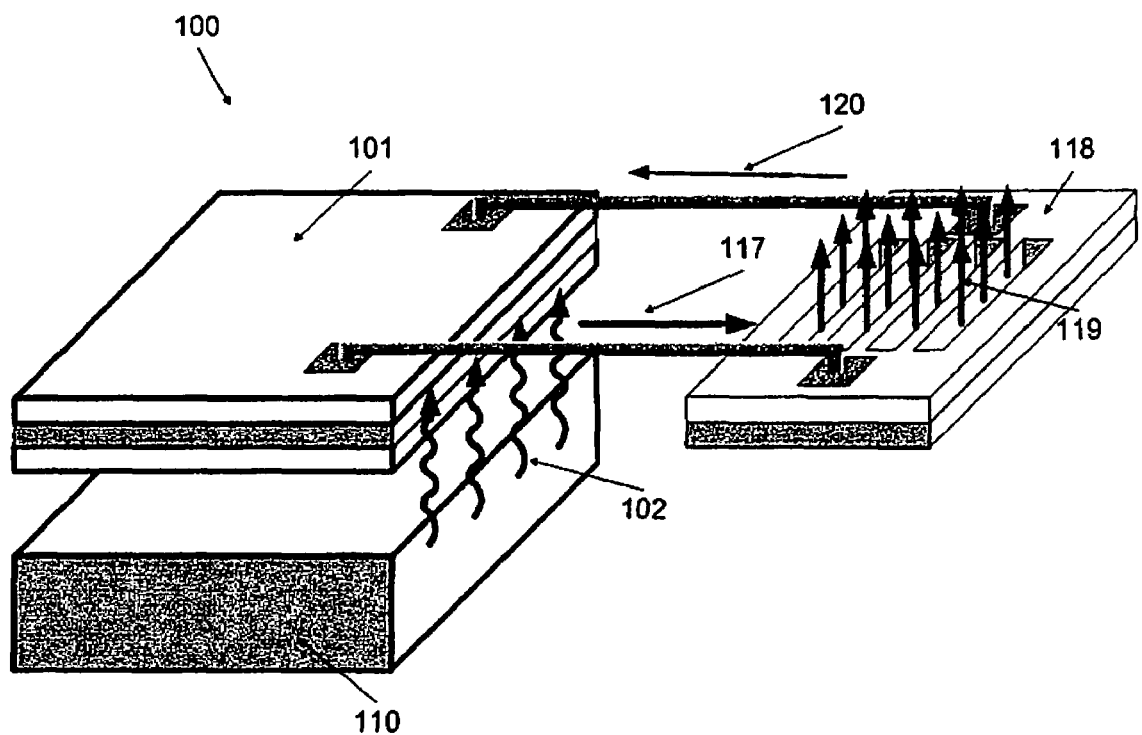
FIG. 11 illustrates another embodiment of the two-phase thermal transfer device cooling a semiconductor chip at the package level utilizing a silicon evaporator and silicon condenser connected with metallic fluidic interconnects.
Figure 12:
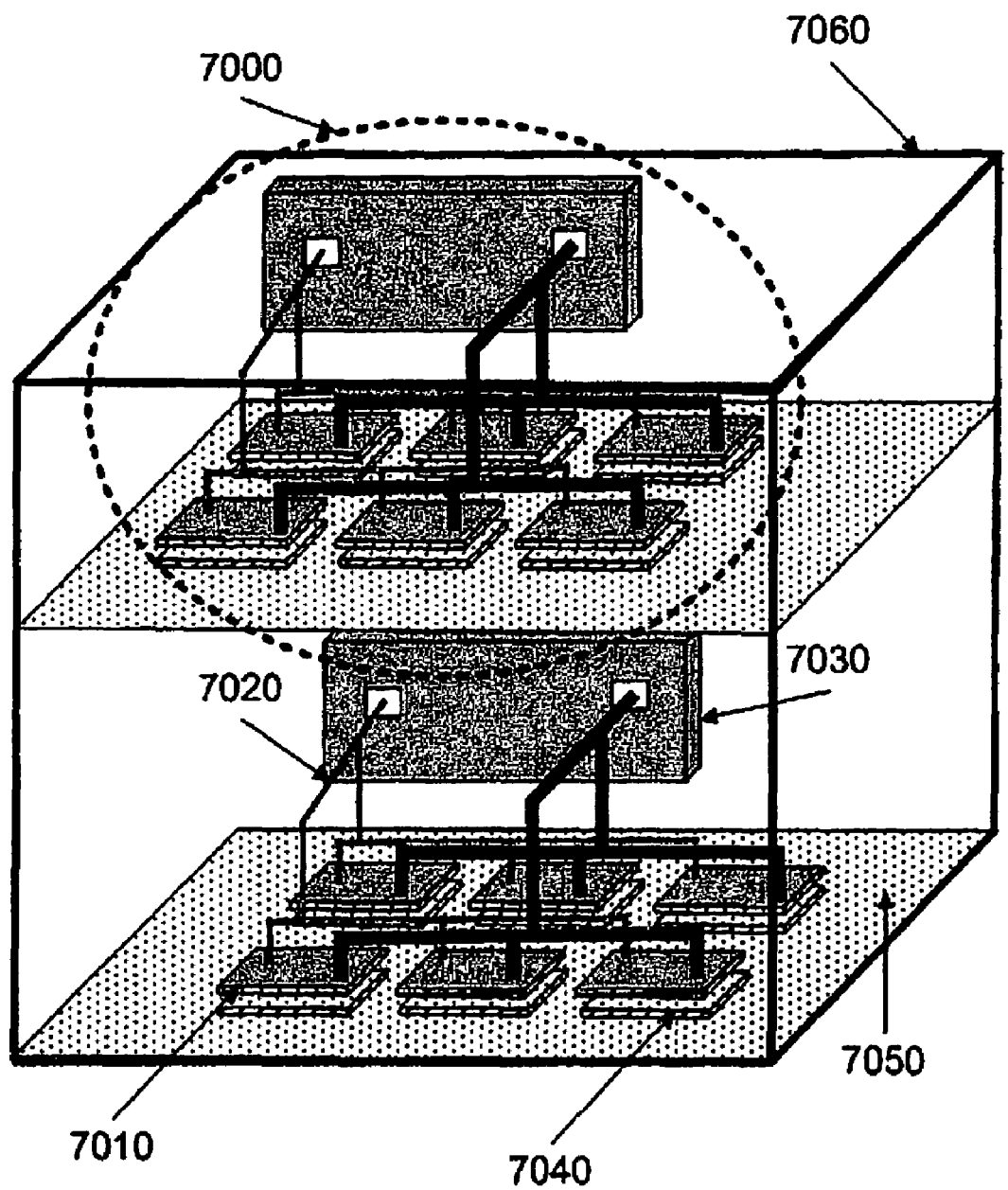
FIG. 12 illustrates an embodiment of the thermal transfer device at the server system level of integration where it acts as a thermal bus system in a blade server application.

FIG. 12 shows the heat transfer device from FIG. 11 at server system level of integration acting as a thermal bus system in a blade server application. The thermal bus system 7000 consists of multiple evaporators 7010 connected by a manifold systems 7020 connected to a central condenser 7030. Each evaporator 7010 is attached to a processor 7040 that resides on a multi-processor rack 7050. Within the server cabinet 7060, multiple racks are used with each containing a thermal bus system 7030. The device has been scaled to a point where it can transport the heat from each microprocessor 7040 unit to a suitable central heat exchange (a condenser/radiator/heat exchanger) location 7030. The transport of waste heat in server applications is a current concern because of the close proximity of both processors 7040 and stacking height between racks 7050.

Figure 13:
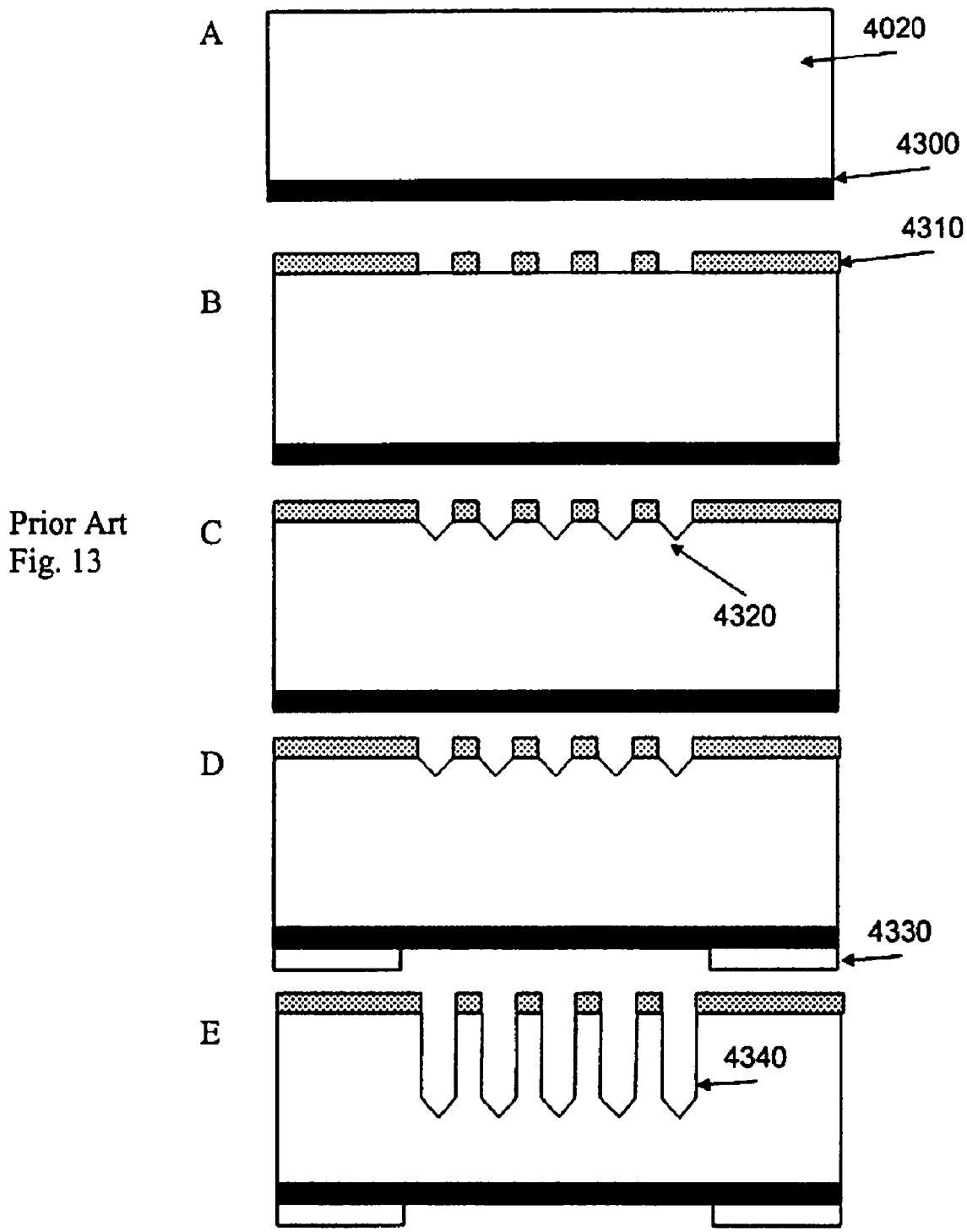
FIG. 13 illustrates a fabrication sequence for forming CPS.

A key to this device is the ability to make the CPS wicks. The CPS arrays in silicon are fabricated in three stages: pre-processing; etching; and post-processing. The preprocessing method is illustrated in part in FIG. 13. In this embodiment, CMOS-grade n-type silicon 4020 with [100] crystal orientation typically between 300-650 microns thick, and having background dopant concentrations between $10^{12}$-$10^{15}$ is used. Silicon dioxide is thermally grown and subsequently stripped from the backside leaving the silicon surface exposed (not shown in FIG. 13). Next, Nt+ diffusion using solid sources in a diffusion furnace is performed. The N+ diffused region 4300 acts as an ohmic contact and makes the electric field more uniform. The N/N+ on the backside junction builds built-in field which pushes the holes towards the pore tips and reduces recombination at the semiconductor surface. The silicon dioxide on the front side prevents any N+ diffusion on the front side of the wafer. Fourth, the Silicon Wafer is stripped of all oxide diluted HF acid. Fifth, low pressure chemical vapor deposition is used to grow a low stress SiN passivation film against the anisotropic KOH etching. Sixth, micron-sized windows in the polymer photoresist are created by photolithography. As shown in FIG. 4A, the passivated areas form the bonding sites to the thermal conduction pathways 113. The windows in SiN 4310 are opened by reactive ion etching (RIE) with common halogen/oxygen gas mixture. The initial etch pits 4320 are created by anisotropic KOH etching. SiN is etched off the backside of the wafer by RIE. Liftoff photolithography on the backside is performed using alignment marks on the mask and the front side of the wafer (infrared aligning). Cr/Au layer 4330 is evaporated to provide light masking and ohmic contact during etching. Then the metal is lifted off using solvent, for instance, acetone.

Figure 14:
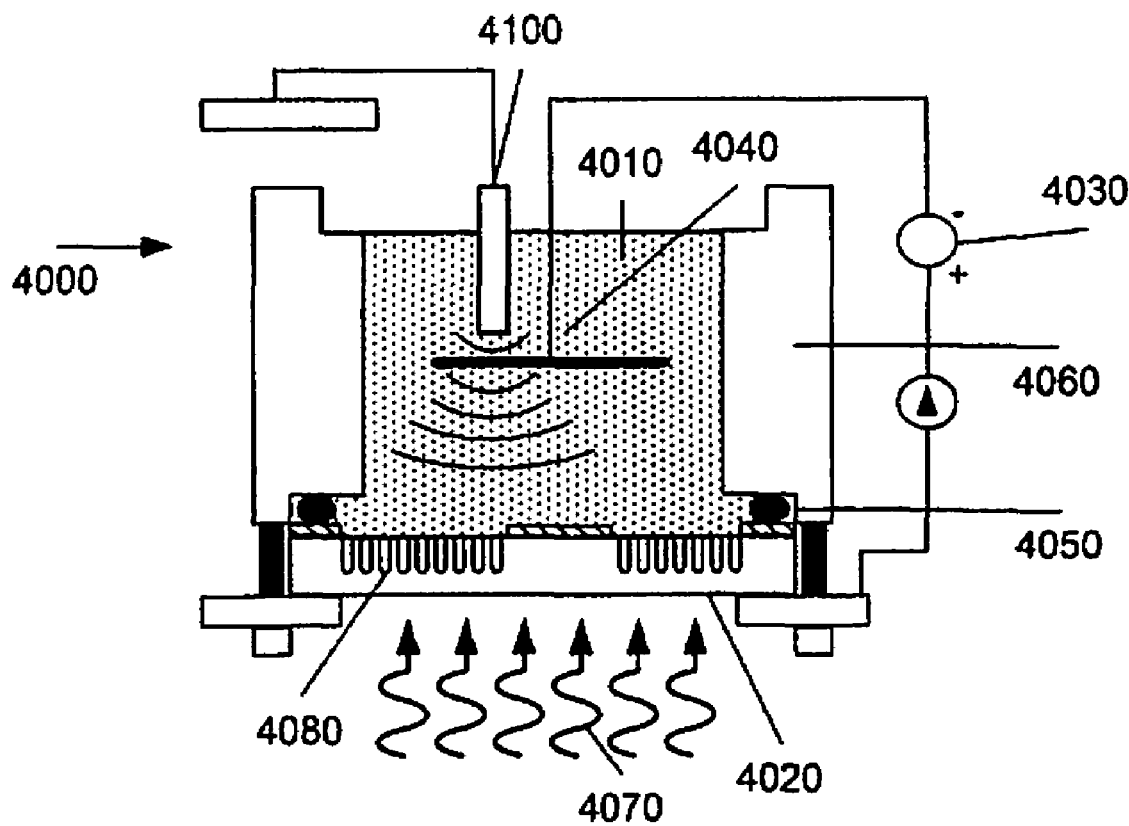
FIG. 14 is a schematic of the photon pumped electrochemical etching cell which is used to form CPS capillaries.

Photon-pumped etching is performed in an electrochemical etch setup 4000 with aqueous or organic HF solution 4010 as shown in FIG. 14. The substrate/working electrode Si 4020 in the electrochemical cell 4000 is anodically-biased 4030 with respect to a counter electrode 4040. The silicon working electrode 4020 is integrated into the electrochemical cell by placing an o-ring 4050 between the cylinder 4060 and the silicon working electrode 4020. When n-type silicon is used as the working electrode, radiation (typically UV) 4070 is used to excite electron-hole pairs. The holes are supplied either by the intrinsic hole concentration in the wafer (for p-type Si) or by external illumination 4070 of the wafer (for n-type Si). The holes created reach the etching interface 4080 and form silicon dioxide, which is subsequently etched by HF 4010. Both inorganic and organic electrolytes can be used. In the preferred embodiment, n-type silicon is positively biased with respect to the HF electrolyte. Electron-hole pairs are created on the backside of the silicon wafer by irradiation. The holes created in the bulk of the wafer drift to the anisotropically etched field concentrators on the top of the surface. Anodic oxidation of the field concentrator and subsequent etching in HF enables high aspect ratio pores in silicon FIG. 4.

Traditional etching methods for creating porous silicon resulted in deterioration of the passivation layer. A new method for etching the CPS generates clearly defined microarrays through surface patterning and successfully grows capillaries in silicon while maintaining a surface roughness less than approximately 1 micron during an aggressive etching cycle. This was accomplished by the development of combinations of electrolyte, passivation film/films, and direct application of degassing force necessary to make capillary growth rate favorably high whilst still preserving the thin passivation film. First, low stress SiN is used as a mask for HF on the front side typically of 0.2-0.5 pm thick. A thin film UV mask of Cr/Au is aligned to the microarray features on the front side. Gold thin films block UV light reaching the backside of the wafer. In regions where microarrays were wanted, the gold mask is selectively removed to allow UV light to penetrate. A thin 50 nm chromium film was used as an adhesion layer and 200 nm of gold film was used as a UV masking layer 4330 (FIG. 13D).

Traditional electrolytes cause damage to the passivation layer. A new organic electrolyte was developed where HF was dissolved in DMF (dimethyl formamide) to form a 5 wt % solution. This solution reduces The $H^+$ concentration of this solution is reduced the solution is insulating. TBAP (tetrabutyl ammonium percolate) is added to the solution to make it conducting. The result is a CPS etching electrolyte with virtually no attack rate of SiN (calculated to be 1.5-2 A/min). This electrolyte had very low etch rates using traditional etching systems.

Figure 15:
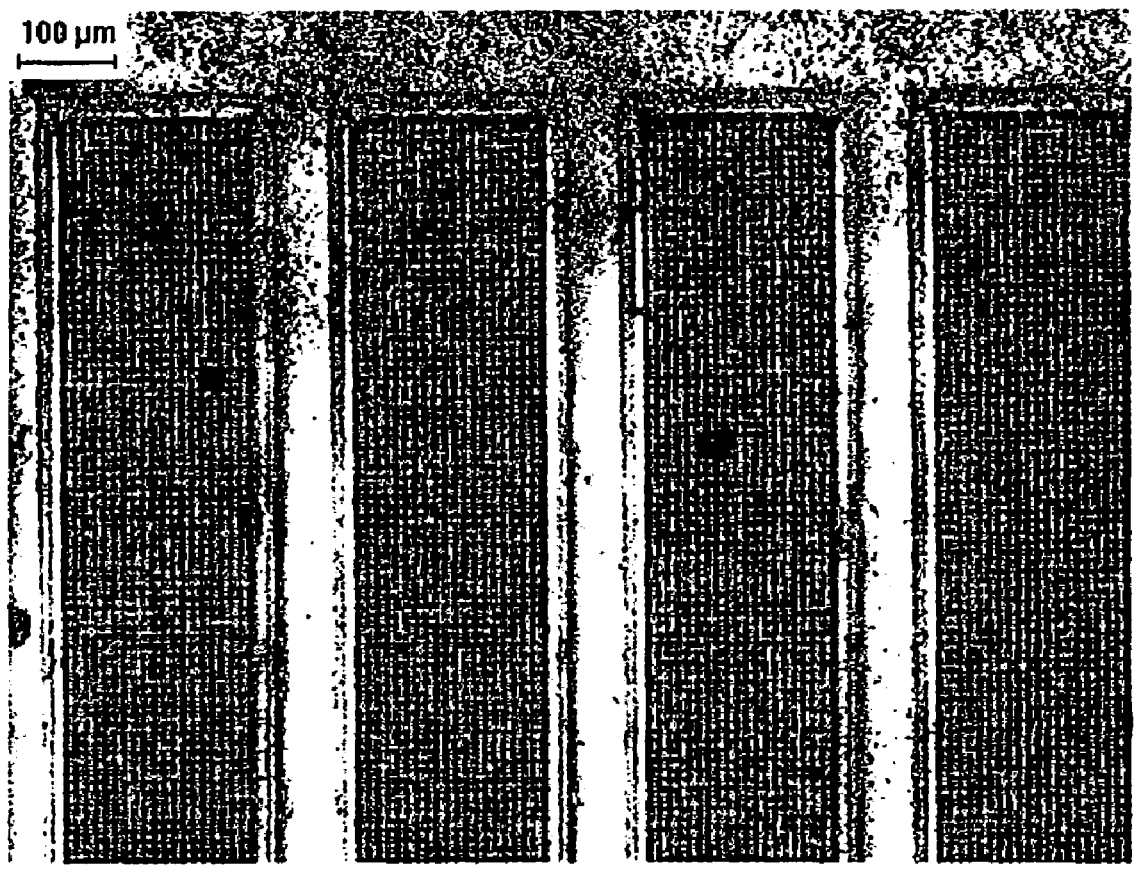
FIG. 15 shows an optical micrograph of CPS microarrays in silicon with 100 micron bonding pads intact.

An agitation system was built to solve the etch rate problem. As shown in FIG. 14, the sonotrode 4100 utilizes external energy, for example ultrasonic waves, to dislodge hydrogen bubbles from the capillaries and aid in mass transport within the cell. The combination of thin film, electrolyte, and agitation mechanism generated etch rates of ~1-2 A/min for the passivation film while etching silicon at ~1.3 micons/min; a selectivity ratio of nearly 10,000 to 1. Using the above methods, CPS microarrays have been created as shown in FIG. 15. In order to realize the type of unit cell configuration depicted in FIG. 4A, a microbond must be formed between the top-cap 114 and the CPS wick 109. Due to constraints of surface roughness and maximum bonding temperature of 600° C., a novel bonding mechanism was developed.

Also, good alignment prior to the bonding of the wick to the top cap is important, i.e. the rails of the top cap should touch and bond to the unpatterned areas of the silicon wick and should not cover any pores. Closure of the pores at the top forces vapor generated in those pores to vent from the backside, which accelerates backside nucleation (i.e., boiling) and stops the cooling process by depriming the CPS wick. The preferred alignment scheme for silicon-to-silicon bonding is the infrared alignment. In this scheme, IR irradiation is through both wafers and the image is captured on a screen where the features or alignment marks on each wafer can be aligned. However, the evaporated metal layers on the mating surfaces prevents IR transmission. The interface should produce a hermetic seal and have a high thermal conductivity. The new process is called In—Au Solid-Liquid Interdiffusion (SLID) or Transient Liquid Phase Bonding (TLP). Information concerning this subject can be found in J. H. Lau, "Chip on Board Technologies for Multichip Modules," International Thomas Publishing, New York, 1994, the content of which is incorporated by reference as if fully set forth herein.

This scheme is akin to eutectic bonding but requires a lamellar structure. The bonding technique allows for bonding with rougher surfaces (i.e. RMS<1 µm) than typical Au—Si eutectic bond (RMS<0.1 µm). Since the intermediate layers, i.e. the metals in this embodiment, show a higher thermal conductivity compared to silicon. When two metals are in intimate contact with each other, the application of heat and increased temperature (with high pressure) will cause the molecules at the interface of the metals to interpenetrate/diffuse thus forming an alloy bond. In most cases, this bonding requires very high temperature and pressures. On the other hand, diffusion in the liquid state is about three orders of magnitude faster and requires low pressures. By triggering a phase change in one of the metal layers, larger diffusion coefficients and faster diffusion times are possible. One of the metals, having a low melting point, forms a surface compatible alloy when combined with a second metal. In this embodiment, gold (Au) and indium (In) are used. The melting point of the In is 157° C. When heated above 157° C., the liquid In diffuses into the solid Au and the alloy (more accurately, the solid solution) $AuIn_2$ is formed. If excess gold is present, the diffusion process continues until the alloy is formed in the stoicheometric proportion of the In present. Once the bond is formed, it does not debond at temperatures less than 459° C. Because the bonding occurs below the eutectic temperature, the residual stress created after cooling to room temperature is very small. As a result, stress-related cracks or deformations at the interface, which results in a premature device failure, is minimal.

Figure 16A:
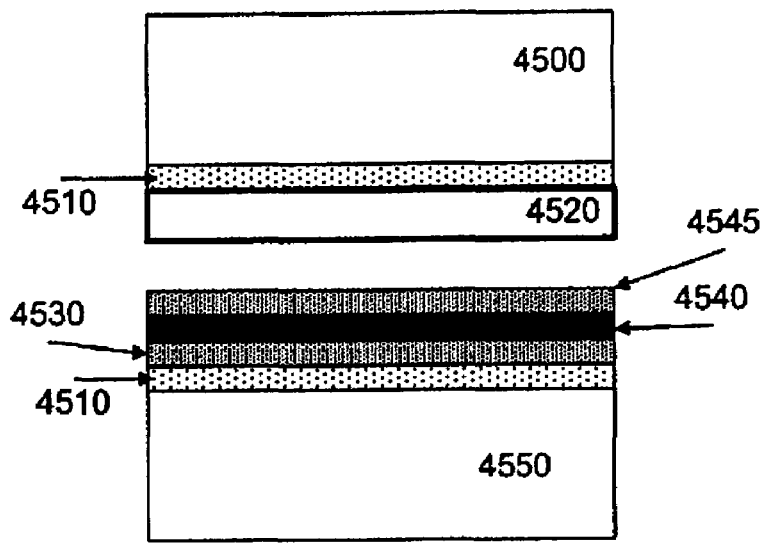
FIG. 16 shows a process flow schematic for a microbonding technique utilized to bond the CPS wick plate to the silicon top-cap.
Figure 16B:
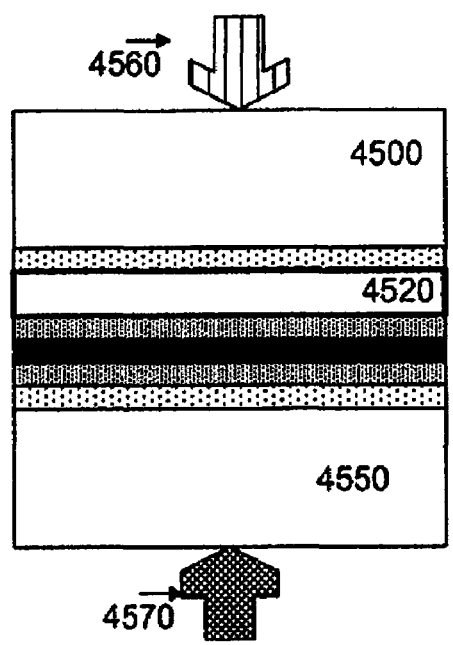
Figure 16C:
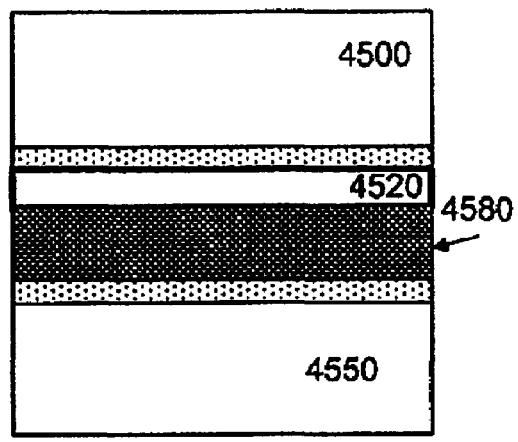

Evaporated In substrates become oxidized when exposed to the atmosphere which hinders the bonding process. To prevent oxidation, the In is sandwiched between two thin Au layers in situ. Within the vacuum environment of the thermal evaporator, the In alloys with the Au thin layers which prevents In oxidation. FIG. 16 shows the basic steps involved in this process. The various thin film metals were deposited on the RCA-cleaned wafer using e-beam evaporation. In FIG. 16, a 30 nm Cr seed layer 4510 and a 100 run Au 4520 is evaporated onto a silicon substrate 4500. On the second silicon substrate 4550, a 30 nm Cr seed layer 4510, 25 nm Au layer 4530, 370 nm In layer 4540 and a final 25 nm Au layer 4545 are evaporated. All the In must be used during the process to effect a good bond.

Figure 17:
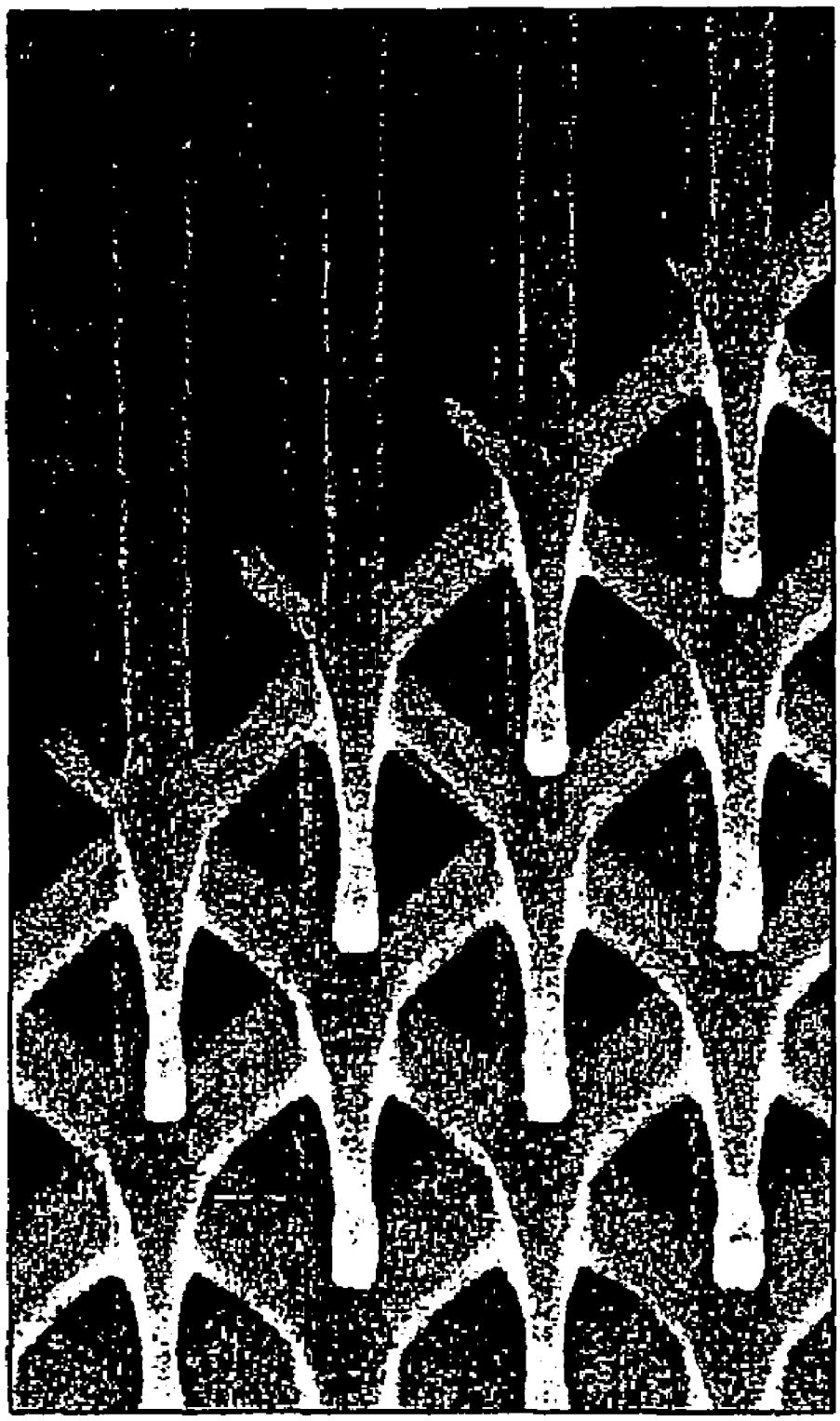
FIG. 17 is an SEM image of one embodiment of an integrated microcapillary screen combining the top-cap and primary wick into a monolithic structure.

The wafers are aligned and tacked with minimal amount of quick drying epoxy (pre-bond) then placed in a bonder. Heat 4570 and pressure 4580 are applied uniformly on the wafer, in the preferred embodiment, for a period of 45 min at 250° C. The resulting structure includes a residual amount of Au 4520, while all of the In 4540 is alloyed to form $AuIn_2$ 4580. Heat delivery to the internal evaporating surface is a paramount concern. An embodiment of the CPS wick shown in FIG. 17 provides a novel method of heat delivery and is referred to as the "integrated micro capillary screen" (IMCS), The evaporator top-cap, the CPS wick (or "screen"), and the secondary wick are fabricated into the same monolithic silicon wafer or chip, eliminating all other parts except for the bottom glass or silicon reservoir.

Figure 18:
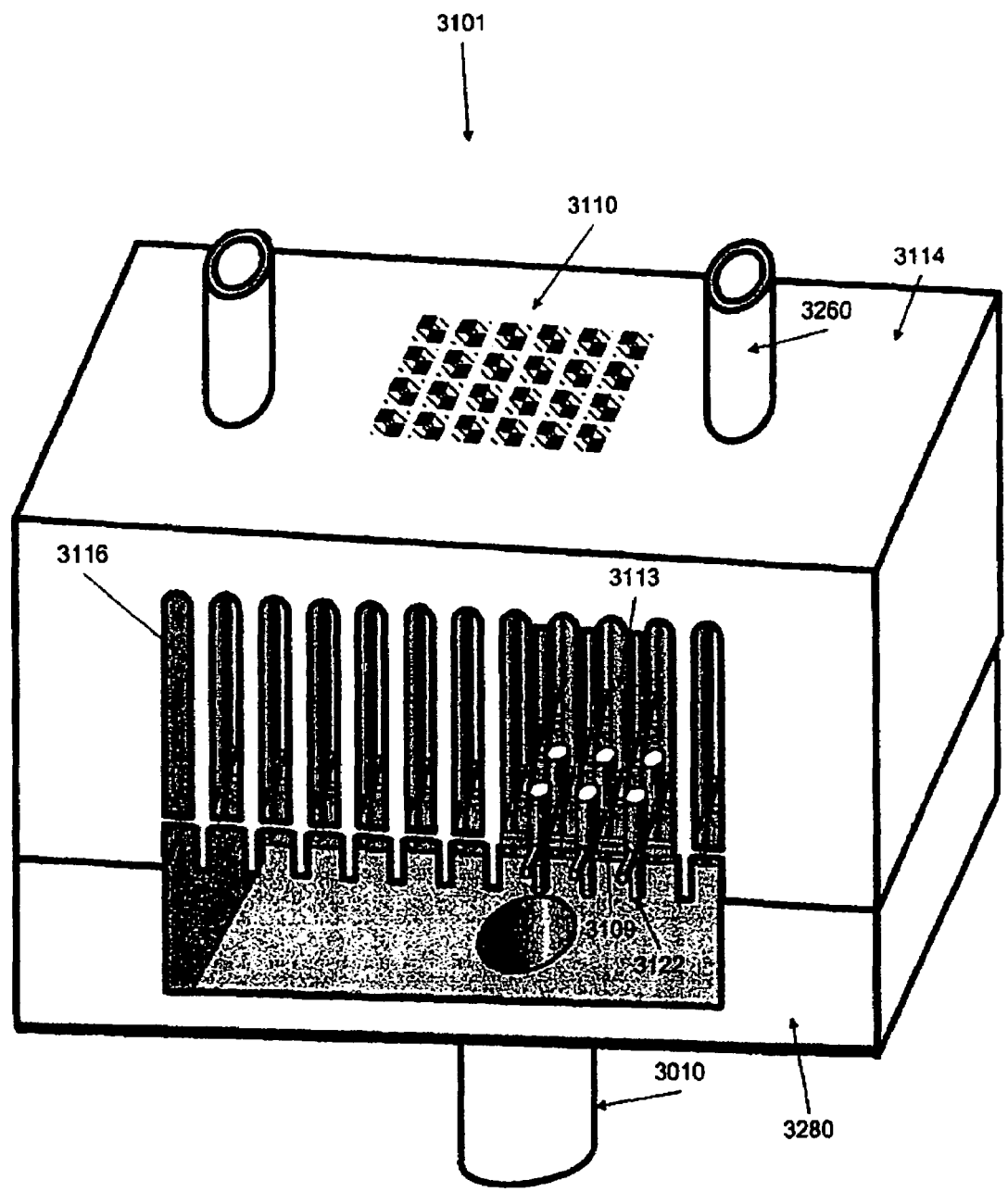
FIG. 18 is a cross-sectional view of one embodiment of a silicon evaporator utilizing the integrated microcapillary screen.

A packaged representation is shown in FIG. 18 (not to scale), where the bottom reservoir plate 3280 has been added. An integrated electronic die 3110 is integrated by direct bonding to a cavity etched in the top surface of the evaporator 3101. This is a truly integrated microchip into a LHP eliminating the troublesome chip package used in industry. The fluidic ports 3010, 3260 are shown in FIG. 18 on top and bottom, however, in other embodiments, the ports could logically connect on the backside. The vapor exit ports 3260 can also be tapped into the upper plenum at any arbitrary location, including the top edge.

The microfabrication of this IMCS evaporator assembly proceeds much as did the earlier CPS wick, except that the CPS photon-controlled electrochemical etching parameters are adjusted so that the diameter of the ordinary capillary "worm holes" are enlarged and interpenetrate on their walls. This leaves silicon microposts 3113 at four corners of each hole in both orthogonal and hexagonally stacked geometries (cut away in FIG. 18) except in a limited area 3109, referred to here as the "silicon microscreen," where the ordinary CPS hole diameter is maintained. This silicon microscreen becomes the actual wick.

Since all internal surfaces/heat conduction pathways 3113 have a hydrophilic $SiO_2$ surface coating (by conventional thermal oxidation), the micromeniscus extends below and above the microscreen wick 3109. The remaining shorter posts 3122 serve as a secondary wick, negating the need for other secondary wicks (e.g. $SiO_2$ fiber in previous embodiments). The open space at the top (interpenetrated by thermally conducting microposts) serves as the vapor channel 3116 or plenum (which can be arbitrarily sized in volume). The whole system, top-cap 3114, thermally conducting posts 3113, "capillary" wick 3109, and secondary wick 3122, is self-aligned except for the reservoir. Moreover, there is one thermally conducting silicon micropost 3113 for each pore or capillary. The most effective heat transfer occurs in the tail of the meniscus contacting the walls. In this embodiment, the meniscus extends into the vapor chamber 3114 on the microposts 3113, which conduct the heat down toward the silicon microscreen 3109. See, R. Oinuma "Fundamental Study of Evaporation Model in Micron Pore", PhD Dissertation, Texas A&M University, 2004, the content of which is incorporated into this application as if fully set forth herein. Thus, most of the heat may never reach the actual microscreen wick 3109, because the heat is shunted off into vapor and latent heat of vaporization, leaving the wick and its backside too cool for nucleate boiling. The thickness of the microscreen wick 3109 can be tailored as desired (within the limitation of silicon wafer thickness) for further thermal isolation. Also, oxidation of the screen can be used to adjust thermal isolation.

In the microfabrication of this embodiment, the variable pore or capillary size can be controlled by several techniques such as: (a) epitaxial layering of materials with varying electrical resistivity, (b) varying parameters such as light intensity, etchant concentration, and temperature dynamically, (c) using the "coking" effect in the initial formation of anisotropically etched initiation pits.

Any and all combinations of elements of the previous five embodiments are possible, including the use of any of the evaporator systems entirely open-ended or in a closed loop, with or without gravity feed or using a separate pump (typically MEMS) feed, with or without a series or parallel reservoir (LHP or CPL) integrated within the silicon or 7740 glass sections of the evaporator package or external to the package.

Any of the above embodiments may also substitute a reservoir base plate that allows both vapor and working fluid ports on the backside. Also when sizing becomes an issue, the basic cell (herein approximately 1 cm$^2$) can be downsized as lithographic processes improve. The cells can be expanded in a two-dimensional matrix of unlimited size and power. An extended matrix has an infinite number of interconnecting schemes, with an optimal configuration for a desired means of condenser placements.

Figure 19:
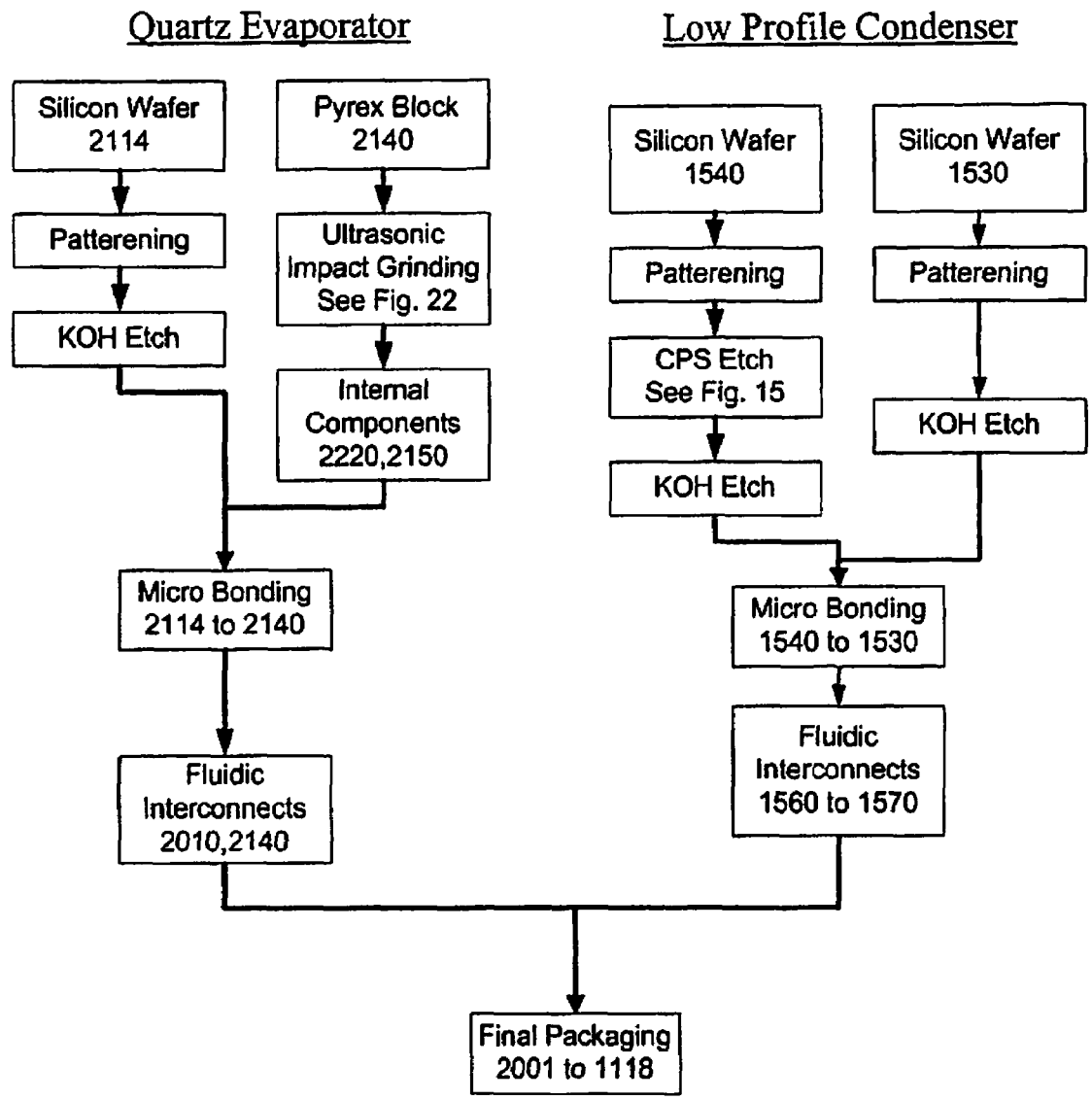
FIG. 19 is the fabrication sequence for the silicon/silicon dioxide evaporator and the air-cooled silicon condenser.

A prototypical fabrication sequence is given in FIG. 19 for the evaporator embodiment in FIG. 9 and condenser embodiment in FIG. 10. Similar design rules and fabrication constraints are utilized in the fabrication of the other embodiments.

The quartz evaporator design is depicted in FIG. 9 and consists primarily of a silicon top-cap 2114 and a glass reservoir 2140. The rendering of the top cap 2114 is accomplished by photolithographic micropatterning of a passivation film and lye etching (ex. KOH). The glass block compensation chamber 2140 is formed by ultrasonic impact grinding (UIG), a technique not commonly used in this field. This technique is described in FIGS. 22 and 23. After formation of the features 2231 and 2280 and inlet and outlet holes the internal component screens 2220 and quartz wick 2150 are assembled into the cavity 2280. This step is shown in FIG. 19 as the placement of the "internal components" of the quartz evaporator. The top cap 2114 is microbonded to the glass compensation chamber 2140. The microbonding technique in FIG. 16 can be used. After the two primary layers are joined, metallic microfluidic interconnects are adjoined directly to the surface as shown if FIGS. 20 and 21. In this commercial design, the quartz evaporator is connected to the low profile condenser shown in FIG. 10 to close the loop.

To further demonstrate the use of novel fabrication techniques within the context of the disclosed technology the low profile condenser manufacturing steps are shown in FIG. 19, This heat exchange component of the loop in FIG. 10 consists primarily of two silicon layers. The silicon used is of [100] crystal orientation, n- or p-type, typically 300-650 microns thick, and typically having background dopant concentrations between $10^{12}$-$10^{15}$. Both silicon layers 1530 and 1540 utilize thin film micropatterening. The top layer 1530 is etched with a lye solution (e.g., KOH, TMAH) to form vias for cross-flowing air 1520. The bottom silicon plate 1540 utilizes the etching technique CPS etching technique described in FIGS. 13-158. The CPS etching technique allows for the formation of high aspect ratio arrays of adjacent fin 1510 and capillary structures 1500 while still keeping multiple fabrication constraints specific to this design within acceptable tolerances levels. After CPS etching, the cavity structures 1550 are formed by an additional etching step (e.g., KOH). The microbonding technique is used to adjoin 1530 and 1540. Finally, microfluidic interconnects 1560 and 1570 are attached to the silicon surface. The evaporator and condenser are joined and evacuated, backfilled, and sealed.

A novel method to create robust yet versatile microfluidic connections between the components of the MEMS-based two-phase heat transfer device. The main disadvantage of traditional bonding schemes is that strong connections cannot be made without high pressure and temperatures. Other disadvantages include the fact that the interconnects cannot maintain internal vacuum. A simple planar fabrication can be used to strongly connect glass or metal (e.g., stainless steel, copper) nipples/tubes to channels or reservoirs that are fabricated on silicon or glass. In fact, application of a normal tension force to the tube bonded to glass or silicon results in material breakage before a bonding failure.

A method of manufacturing is illustrated in FIG. 20. The method comprises the following steps:

(1) Careful cleaning of the surface the connection to be made 5100 FIG. 19(a). The preferred cleaning method is "RCA" cleaning, which consists of three steps: (i) solvent cleaning using warm acetone or methanol followed by rinse in DI (deionized) water, (ii) base cleaning using a hot mixture (~70° C.) of DI water/NH$_4$OH/H$_2$O0 (5:1:1) followed by rinse in DI water, (iii) acid cleaning using a hot mixture (~70° C.) of DI water/HCl/H$_2$O$_2$ (4:1:1) followed by rinse in DI water.

(2) Evaporation of a thin layer (typically, 200-500 nm) of metal (e.g., Ni, Au, Cu, Sn) 5300 with a Cr or Ti seed layer 5400 (~30 nm) on the surface that surrounds the prefabricated entrance/exit orifice.

(3) Preparation of the stainless steel (or other metallic) tube to be connected.
   (a) Dress the end of the tube 5000 so that it is flat for coherent contact with the bonding surface.
   (b) If bonding to a metal surface, a fine abrasive compound or material should be used to remove any oxide then wipe with methanol.
   (c) If bonding to a glass tube 5500, as in FIG. 20B, clean the glass (preferably by RCA cleaning) and evaporate or use electroless plating to deposit a thin layer of metal, as done in the Step (2), around the rim of the tube. Any thin film coating mechanism can be used as long as the film is not subject to delamination.

(4) Align the tube and the orifice; clamp to ensure intimate contact.

(5) Make the joint:
   (a) Apply a very small amount of liquid flux to the joint;
   (b) Heat the joint;
   (c) Apply solder 5200 FIG. 20A to the joint.
   (d) Another way to accomplish this boundary is to use a solder pre-form FIGS. 20A, B and/or eutectic pre-form (not shown here) in the junction and use the heat source to bring the junction to the melting/eutectic temperature which will secure the connection.
   (e) Another possibility in production is to perform the solder by casting/molding as in FIGS. 20A and B and to include a restive wire to act as the source of heat. During the automated soldering process, current is passed though the wire and remains interior to the bond afterward.

Figure 20A:
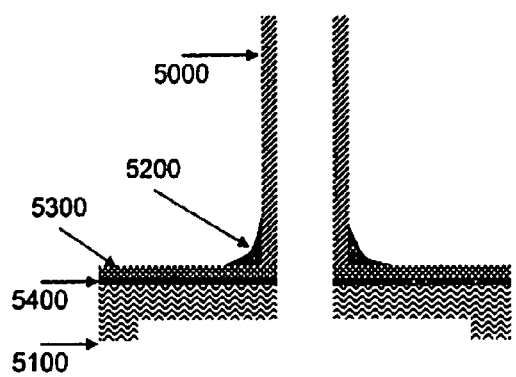
FIG. 20 is a series of schematics showing several embodiments of the microfluidic interconnect scheme where (A) a metallic tube is attached to a ceramic (e.g., silicon, glass), (B) a glass tube is attached to a ceramic (e.g., silicon, glass), (C) a metallic tube-ceramic interconnect with increased resistance to tensile force, (D) a metallic tube-ceramic interconnect with increased resistance to sheer force.
Figure 20B:
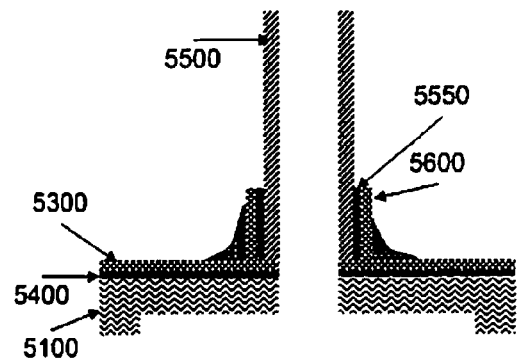
Figure 20C:
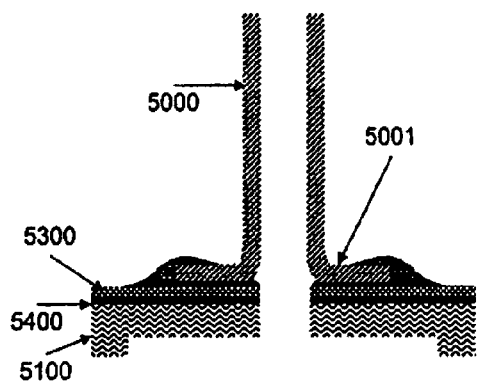
Figure 20D:
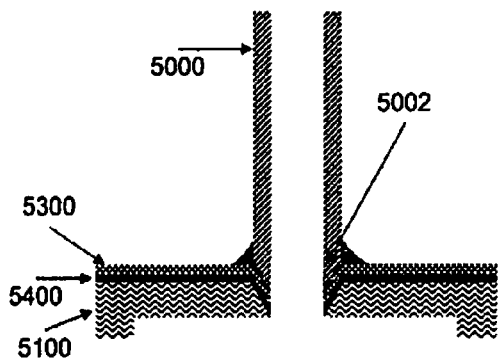
Figure 21A:
FIG. 21 illustrates shapes of the solder preforms: (A) annular shaped and (B) counter sink for facile solder application during high speed manufacturing.
Figure 21B:
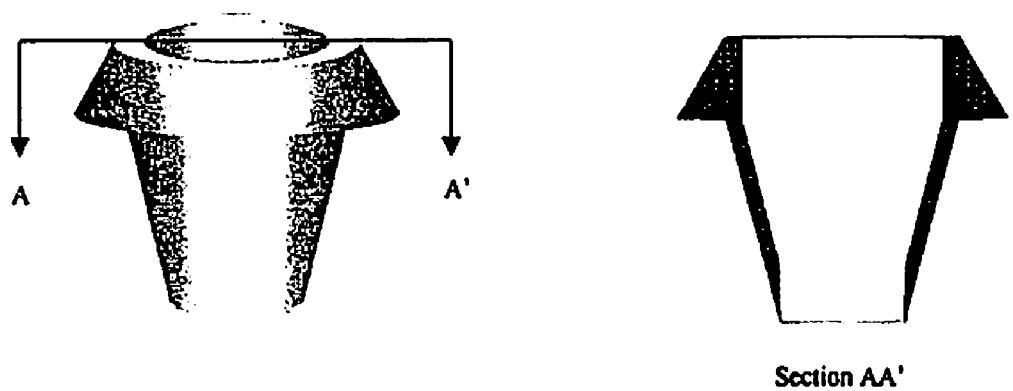

Other application-specific variations rely on the same basic concepts as the above method. The basic interconnection scheme is shown in FIG. 20A, where a metallic tube 5000 is directly attached to ceramic substrate 5100. In some applications it is necessary to connect clear glass tubing (FIG. 20B). The glass tube 5500 is coated with 5550 a seed layer (e.g., Cr or Sn), and coated with a Ni layer 5600 by either thermal evaporation process or electroless plating. The substrate holding plate of the evaporator should have a rotating horizontal spindle to attach the tube so that the metal is uniformly deposited. The solder is heated to liquid phase and attaches to Ni layer 5300 of the substrate and Ni layer 5600 of the glass tube 5500. For a higher strength connection under normal loading, a flared connection can be made as in FIG. 20C. This connection is common to FIG. 20A but the metallic tube 5000 has been flared 5001. If a high shear strength connection is desired, a metallic tube 5000 dressed to have a tapered end can be used as shown in FIG. 20D. The tapered end acts as a male fit to a concave taper 5002 that exists in the ceramic substrate 5100. Other metals besides Ni may be used, such as gold, copper or any other "solderable" metal. In the preferred embodiment the connection tubes 5000 are either stainless steel or copper, but any other "solderable" metal tube can be used. For mass production, an appropriate prefabricated solder/eutectic "pre-form" can be placed on lithographically patterned substrate. Possible pre-forms are shown in FIG. 21. The preform can be a simple donut shape (FIG. 20A) or could counter-sink with the bonding orifice (FIG. 20B).

Figure 22:
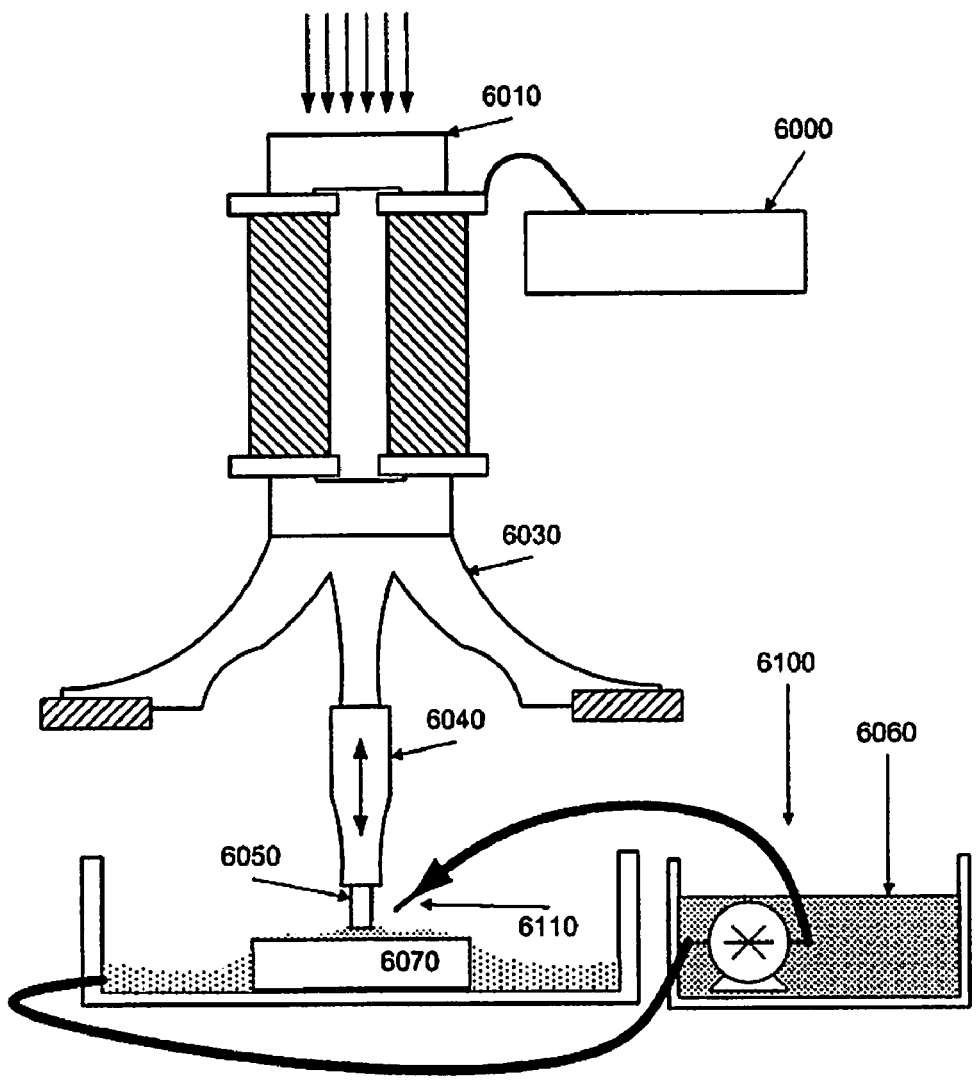
FIG. 22 is a schematic of the ultrasonic impact grinding (UIG) tool used to make structures in glass and ceramics for use in the thermal transfer devices.
Figure 23:
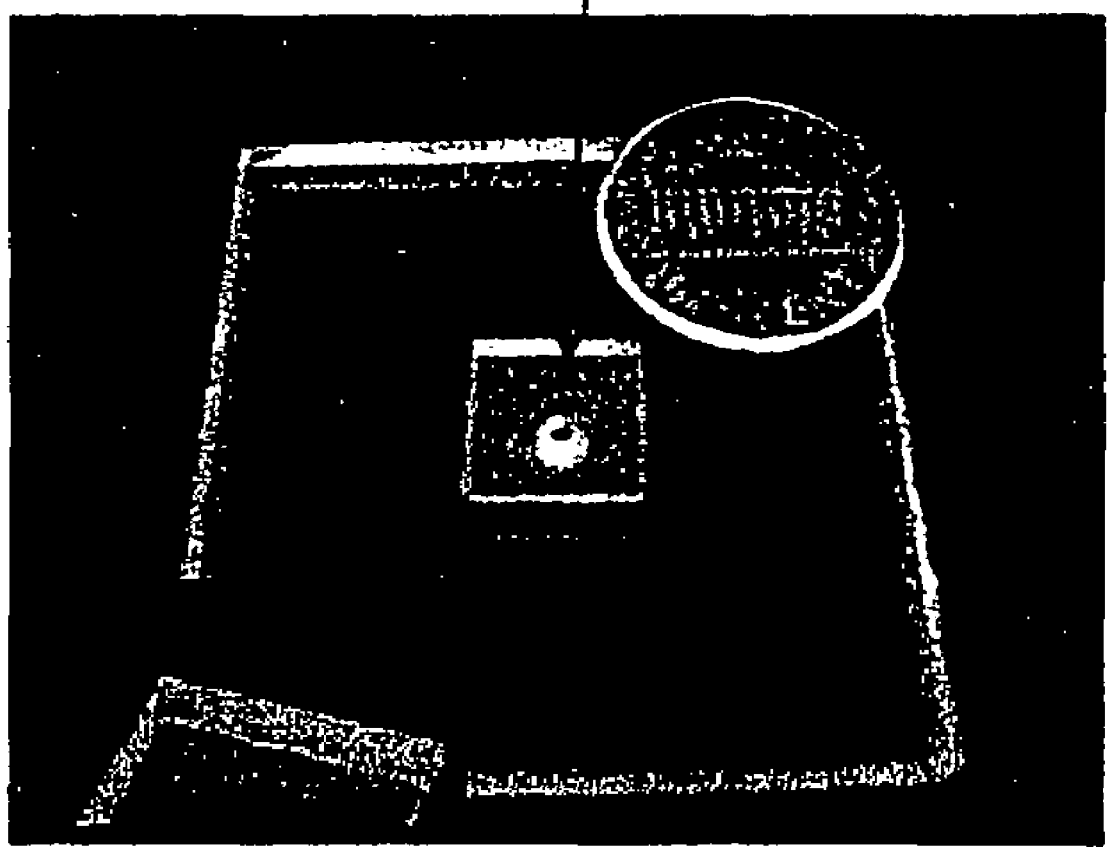
FIG. 23 shows an inset ultrasonically machined borosilicate glass, vertical walled, 3 mm deep square reservoir with a stepped/tapered 1.33 mm ID inlet/outlet hole at the center to accommodate microfluidic interconnects. Insert shows the smooth sidewall surface of a corner of the reservoir.

Component structures in silicon, glass, or ceramic for the thermal transfer device were made using ultrasonic impact grinding (UIG). This technique has not been used in MEMS applications, especially loop heat pipe/heat transfer device fabrication. FIG. 22 shows the schematic of the head assembly of magnetostrictively-driven UIG assembly. A glass structure machined using this scheme is shown in FIG. 23. The tool head 6050 vibrates vertically at a resonance frequency (typically, 20-28 kHz) of the compound system comprised of the transducer 6010, transmitting cone 6030, tool cone 6040, and tool head 6050. The transducer 6010 is driven at a resonance frequency by an ultrasonic amplifier 6000. The mechanical vibration of the transducer is transmitted through the system components to the tool head 6050. An abrasive slurry 6060 (typically silicon carbide or boron carbide abrasive grit mixed with water) is passed over the working material 6070 (glass, ceramic, or silicon component of the thermal transducer). The grit is squeezed between the work piece 6070 and the tool head 6050 resulting in grinding by minute ultrasonic pounding. The resultant shape in the work piece 6070 is the complement or negative of the tool head 6050 shape. UIG can transfer virtually any image while grinding a cavity or cavities of virtually any form. The vertical amplitude of the ultrasonic vibration of the tool head 6050 will typically be on the order of tens of micrometers.

The pattern's dimensions are limited by the master pattern on the tool head 6050 and the size of the particles in the slurry 6060. As the desired features shrink to smaller sizes, alternative techniques can be used to fabricate tool heads 6010, including electrodischarge machining, or UV-LIGA and subsequent electroplating/electroless deposition. As dimensions shrink, the slurry may become a limiting factor. This hurdle is overcome by impregnating the microfabricated tool head with abrasive particulate (e.g., silicon carbide, aluminum oxide). A cutting fluid (e.g., water) can be used as the lubricant which relieves the constraints due to the mobile slurry. Structures with the smallest dimension in the range of several tens to hundreds of micrometers can be fabricated using this technique. As the process of machining occurs, the slurry 6060 becomes crushed diminishing the cutting rate and eventually leading to no grinding. A circulating abrasive system 6100 feeds new abrasive particles in between the tool head 6050 and the work piece 6070 by way of a spray nozzle 6110 and removes the crushed and chipped particles of the work piece from the grinding zone. In this particular embodiment, tool heads 6050 made of stainless steel mild steel, and copper have been used. The work piece 6070 was glass or silicon, and the abrasive 6060 used is 600 grit silicon carbide mixed with water in a 1:1 ratio.

With respect to the above description, the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A system for transferring heat, the heat transfer system comprising:
   an evaporator comprising a semiconductor layer having porous regions formed at predetermined regions;
   wherein a first surface of the semiconductor layer encapsulated by a cap structure via contacts at a first portion of non-porous regions of the semiconductor layer, a second surface of the semiconductor layer coupled to a chamber formed with a recessed region adjacent to the second surface of the semiconductor layer; and
   wherein the chamber is formed with at least one liquid inlet port and the cap structure is formed with at least one vapor outlet port;
   a condenser having at least one vapor inlet port and at least one liquid outlet port;
   at first set of channels to couple the at least one vapor outlet port of the evaporator with the at least one vapor inlet port of the condenser;
   a second set of channels to couple the at least one liquid outlet port of the condenser with the at least one liquid inlet port of the evaporator; and
   wherein the first and second sets of channels form a substantially hermetically sealed chamber between the evaporator and the condenser.

2. The system of claim 1, wherein, the porous regions of the semiconductor layer, comprises substantially of, coherent porous silicon.

3. The system of claim 1, wherein the cap structure is formed with protruding structures that extend inward from an interior surface of the cap structure to contact the first surface of the semiconductor layer at a second portion of the set of non-porous regions of the semiconductor layer.

4. The system of claim 1, wherein liquid is disposable in the recessed region of the chamber to be substantially in contact with at least a portion of the porous regions at the second surface of the semiconductor layer; wherein the liquid is to be supplied via the at least one liquid inlet port.

5. The system of claim 1, wherein the chamber comprises substantially of, one or more of, borosilite glass, silicon, ceramics, and silicon dioxide.

6. The system of claim 1, wherein an exterior surface of the cap structure is suited to be thermally coupled to a heat source.

7. The system of claim 1, wherein the first layer is coupled to the cap structure via wafer bonding.

8. The system of claim 1, where in the chamber is coupled to the second surface of the first layer via wafer bonding.

9. The system of claim 1, wherein the cap structure comprises substantially of, thermally conductive material.

10. The system of claim 9, wherein the cap structure comprises substantially of one or more of, silicon and CMOS-grade silicon.

11. The system of claim 1, wherein the condenser is one or more of, formed with fin-like structures and thermally coupled to fin-like structures.

12. The system of claim 11, wherein the condenser comprises substantially of, one or more of, copper-based substances, aluminum-based substances, and silver-based substances.

13. The system of claim 1, further comprising a fluid-guiding structure formed around at least a portion of the condenser, the fluid-guiding structure having a coolant inlet and a coolant outlet.

* * * * *